United States Patent
Sato et al.

(10) Patent No.: US 7,573,697 B2
(45) Date of Patent: Aug. 11, 2009

(54) METHOD OF MANUFACTURING CAPACITOR FOR INCORPORATION IN WIRING BOARD, CAPACITOR FOR INCORPORATION IN WIRING BOARD, AND WIRING BOARD

(75) Inventors: Motohiko Sato, Konan (JP); Kazuhiro Hayashi, Komaki (JP); Akifumi Tosa, Komaki (JP); Kenji Murakami, Kani (JP); Tomohide Yamada, Komaki (JP); Motonobu Kurahashi, Konan (JP)

(73) Assignee: NGK Spark Plug Co., Ltd., Aichi (JP)

( * ) Notice: Subject to any disclaimer, the term of this patent is extended or adjusted under 35 U.S.C. 154(b) by 261 days.

(21) Appl. No.: 11/512,247

(22) Filed: Aug. 30, 2006

(65) Prior Publication Data

US 2007/0047175 A1    Mar. 1, 2007

(30) Foreign Application Priority Data

| | | |
|---|---|---|
| Aug. 31, 2005 | (JP) | P2005-251953 |
| Sep. 7, 2005 | (JP) | P2005-259502 |
| Jun. 19, 2006 | (JP) | P2006-168457 |
| Jun. 19, 2006 | (JP) | P2006-168458 |

(51) Int. Cl.
H01G 4/228 (2006.01)

(52) U.S. Cl. .............. 361/306.1; 361/306.3; 361/321.1; 361/321.2; 361/303; 361/305

(58) Field of Classification Search .............. 361/306.1, 361/311–313, 306.3, 321.1, 321.2, 302–305
See application file for complete search history.

(56) References Cited

U.S. PATENT DOCUMENTS

| | | | | |
|---|---|---|---|---|
| 5,406,447 | A * | 4/1995 | Miyazaki | 361/313 |
| 5,920,453 | A * | 7/1999 | Evans et al. | 361/303 |
| 6,593,639 | B2 * | 7/2003 | Yach et al. | 257/532 |
| 6,979,890 | B2 | 12/2005 | Kambe et al. | |
| 7,050,288 | B2 * | 5/2006 | Ahiko et al. | 361/303 |
| 7,394,643 | B2 * | 7/2008 | Yamane et al. | 361/303 |
| 2005/0207091 | A1 | 9/2005 | Kambe et al. | |

FOREIGN PATENT DOCUMENTS

| | | | |
|---|---|---|---|
| JP | 2002-280250 | A | 9/2002 |
| JP | 2004-228190 | A | 8/2004 |
| JP | 2005-39217 | A | 2/2005 |
| JP | 2005-39243 | A | 2/2005 |

* cited by examiner

*Primary Examiner*—Nguyen T Ha
(74) *Attorney, Agent, or Firm*—Sughrue Mion, PLLC

(57) ABSTRACT

A capacitor comprising: a plurality of laminated dielectric layers; a plurality of inner electrode layers each disposed between mutually adjacent ones of the dielectric layers; and dummy electrode layers respectively disposed between the dielectric layers, disposed on sides closer to outer peripheral sides of the dielectric layers than to the inner electrode layers and disposed apart from the inner electrode layers.

15 Claims, 27 Drawing Sheets

METHOD OF MANUFACTURING CAPACITOR FOR INCORPORATION IN WIRING BOARD, CAPACITOR FOR INCORPORATION IN WIRING BOARD, AND WIRING BOARD

FIELD OF THE INVENTION

The present invention relates to a method of manufacturing a capacitor for incorporation in a wiring board, a capacitor for incorporation in a wiring board, and a wiring board having the same.

BACKGROUND OF THE INVENTION

In recent years, the speed of the operation of semiconductor chips is becoming increasingly higher due to advancement in the integrated circuit technology. In conjunction with this trend, there are cases where noise is superimposed on the power source wiring and the like, possibly resulting in erroneous operation. Accordingly, a capacitor is mounted on an upper surface or a lower surface of a wiring board on which the semiconductor chip is mounted, so as to eliminate the noise.

With the above-described technique, however, since it is necessary to mount the capacitor separately after the completion of the wiring board, the number of processes disadvantageously increases. In addition, there is a need to secure in advance a region where the capacitor is mounted on the wiring board, so that the freedom of the layout of other electronic components declines. Furthermore, because the region where the capacitor is mounted on the wiring board is restricted by other wiring and the like, the wiring distance between the capacitor and the semiconductor chip becomes long, so that the wiring resistance and inductance in the wiring become disadvantageously large.

For these reasons, a technique for incorporating the capacitor in the wiring board has been proposed. As technique for incorporating the capacitor in the wiring board, for example, there is a technique is which an opening is provided in a core board which constitutes a core of the wiring board, and the capacitor is accommodated in this opening.

In this technique, since it is necessary to fix the capacitor to the core board, a resin filler is filled in the gaps between the core board and the capacitor in a state in which the capacitor is disposed in the opening of the core board. Specifically, an adhesive tape is adhered to the reverse surface of the core board, and the capacitor is disposed in the opening of the core board so that the reverse surface of the capacitor will be adhered to the adhesive tape. The resin filler is filled in a state in which the position of the capacitor with respect to the core board is fixed by the adhesive tape.

However, since the thickness of end portions of a conventional capacitor is thinner than the thickness of the remaining portions, steps are formed at the end portions of the capacitor. For this reason, if the resin filler is filled, the resin filler unfavorably enters the reverse surface side of the capacitor. As a result, the resin filler comes into contact with outer terminals disposed on the reverse surface of the capacitor, so that there is a possibility of resulting in faulty conduction, or a step of removing that resin filler is disadvantageously required.

It should be noted that a capacitor has been disclosed in which an outer peripheral surface of an inner electrode layer is exposed from between ceramic layers (e.g., JP-A-2004-228190). However, since only the outer peripheral surface of one side of the inner electrode layer is exposed, it is considered that the aforementioned steps are not alleviated sufficiently. In addition, although a disclosure is given in JP-A-2002-280250 as to the suppression of stepped portions in a general capacitor, this is a type in which the inner electrode is exposed on the outer peripheral surface.

SUMMARY OF THE INVENTION

The present invention has been devised to overcome the above-described problems. Namely, an object of the invention is to provide a method of manufacturing a capacitor for incorporation in a wiring board which makes it possible to reduce faulty conduction in the case where the capacitor is incorporated in the wiring board, as well as a capacitor for incorporation in a wiring board and a wiring board having the same.

In accordance with a first aspect of the invention, there is provided a capacitor for incorporation in a wiring board, comprising: a plurality of laminated dielectric layers; a plurality of inner electrode layers each disposed between mutually adjacent ones of the dielectric layers; and dummy electrode layers respectively disposed between the dielectric layers and on sides closer to outer peripheral sides of the dielectric layers than to the inner electrode layers at predetermined distances from the inner electrode layers.

In accordance with a second aspect of the invention, there is provided a capacitor for incorporation in a wiring board, comprising: a plurality of laminated dielectric layers; and a plurality of inner electrode layers each disposed between mutually adjacent ones of the dielectric layers, wherein almost all of outer peripheral surfaces of almost all of the inner electrode layers are exposed from between the dielectric layers.

In accordance with a third aspect of the invention, there is provided a method of manufacturing a capacitor for incorporation in a wiring board including a capacitor body portion having a plurality of dielectric layers and a plurality of inner electrode layers each disposed between mutually adjacent ones of the dielectric layers, as well as a capacitor end portion covering outer peripheral surfaces of the inner electrode layers and constituted of a dielectric material, comprising the steps of:

forming an inner electrode pattern serving as the inner electrode layer, the inner electrode pattern being formed on a surface of a dielectric sheet in a region serving as the capacitor body portion; and forming a first dielectric pattern serving as a portion of the capacitor end portion, the first dielectric pattern being formed on a surface of a dielectric sheet in a region serving as the capacitor end portion.

In accordance with a fourth aspect of the invention, there is provided a capacitor for incorporation in a wiring board, comprising:

a capacitor body portion having a plurality of dielectric layers and a plurality of inner electrode layers each disposed between mutually adjacent ones of the dielectric layers; and a capacitor end portion covering outer peripheral surfaces of the inner electrode layers and constituted of a dielectric material, wherein a thickness of the capacitor end portion is thicker than a total thickness of the dielectric layers in the capacitor body portion.

In accordance with a further aspect of the invention, there is provided a wiring board incorporating the capacitor for incorporation in a wiring board according to any one of the above-described aspects of the invention.

In accordance with the method of manufacturing a capacitor for incorporation in a wiring board and the capacitor for incorporation in a wiring board according to the first to fourth aspects of the invention, since it is possible to provide a capacitor for incorporation in a wiring board in which steps in the vicinities of the end portions of the capacitor are sufficiently alleviated, it is possible to reduce faulty conduction in the case where the capacitor for incorporation in a wiring board is incorporated in the wiring board. In addition, in accordance with the wiring board according to the further aspect of the invention, it is possible to provide a wiring board in which faulty conduction is reduced.

Figure 1:
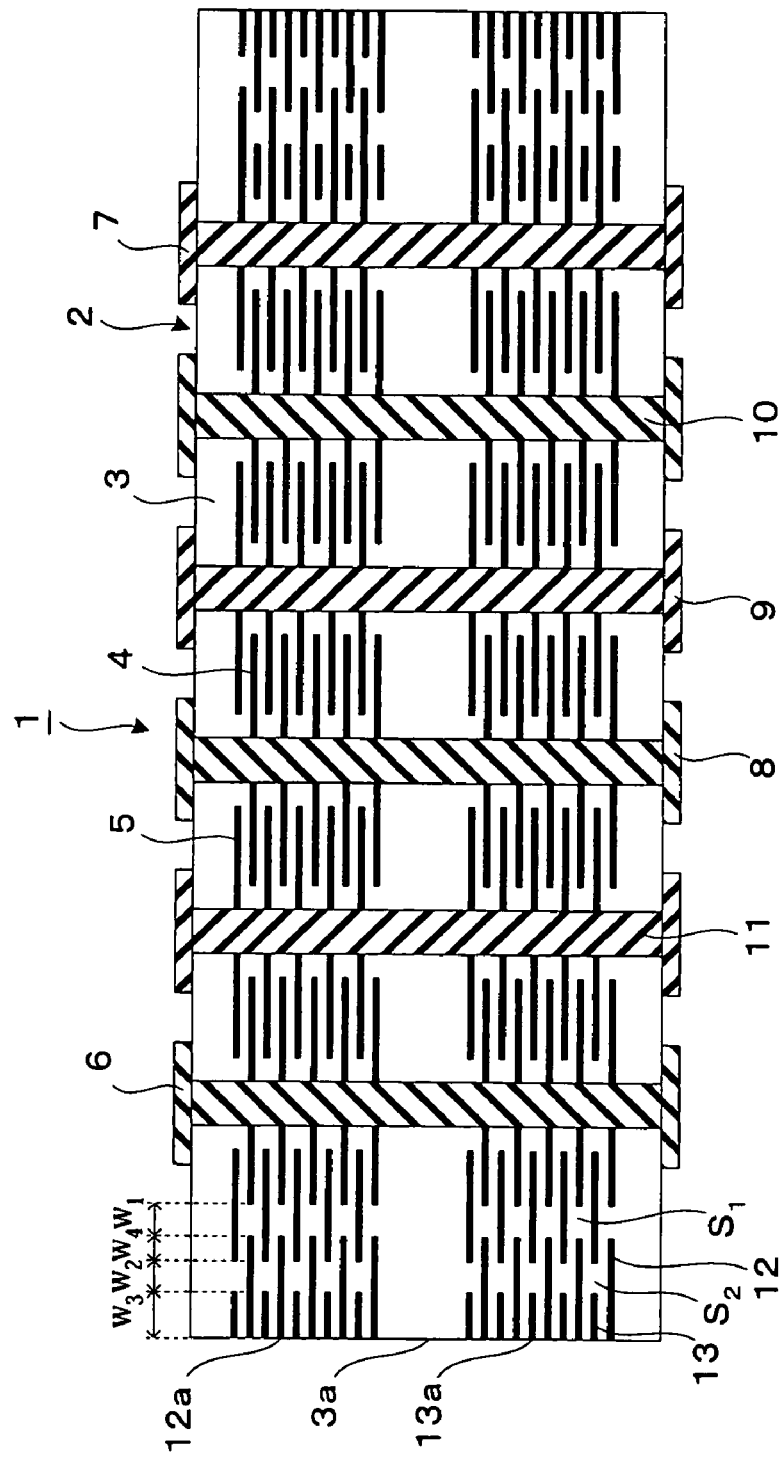
FIG. 1 is a schematic vertical cross-sectional view of a capacitor for incorporation in a wiring board in accordance with a first embodiment.

DESCRIPTION OF REFERENCE NUMERALS AND SIGNS 1, 70, 80, 110, 111: capacitor
3: ceramic layer
4, 5: inner electrode layer
4b, 5b: outer peripheral surface
10, 11: via conductor
12, 13: dummy electrode layer
12a, 13a: outer peripheral surface
40, 100, 140, 180: wiring board
41: core board
42: resin filler
2: capacitor body
2a: capacitor body portion
2b: capacitor end portion
14a, 15a: outer peripheral surface
121, 124, 127, 135: ceramic pattern
122, 125, 128, 129: ceramic green sheet
123, 126: inner electrode pattern

DETAILED DESCRIPTION OF THE INVENTION

First Embodiment

Figure 2A:
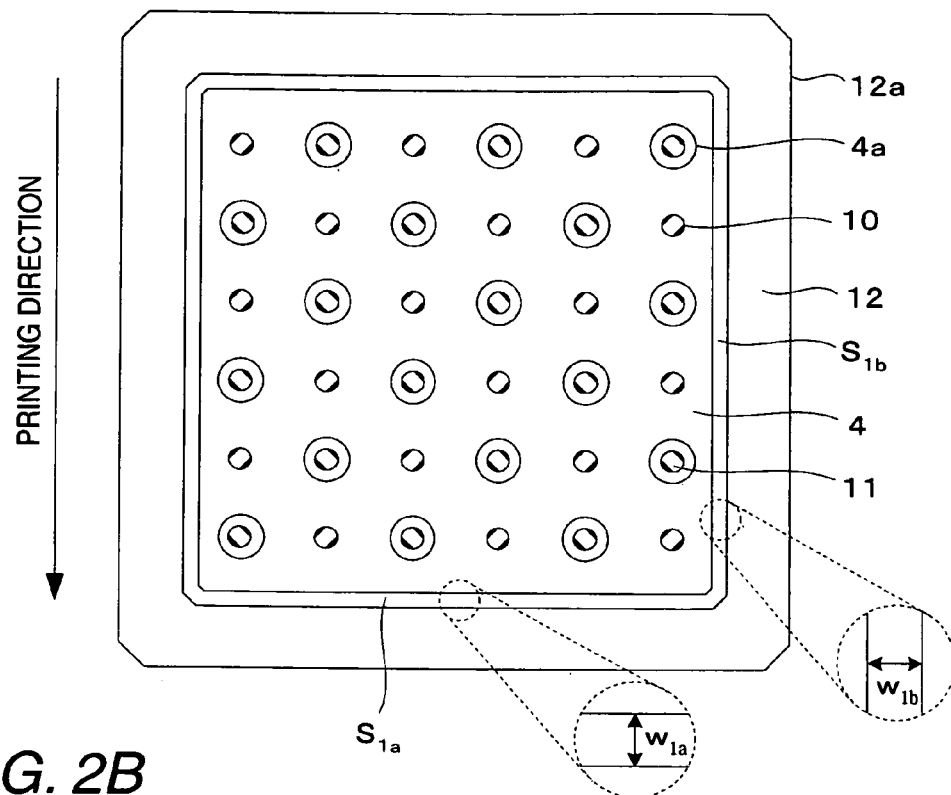
FIGS. 2A and 2B are schematic horizontal cross-sectional views of the capacitor for incorporation in a wiring board in accordance with the first embodiment.
Figure 2B:
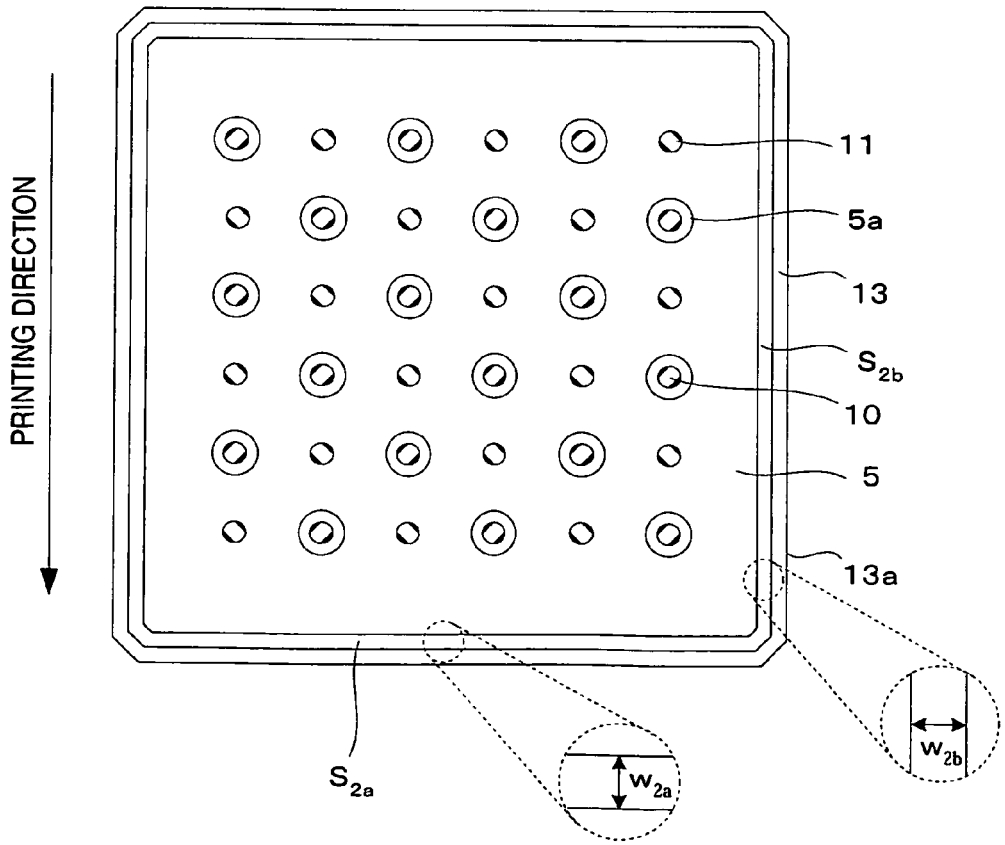
Figure 3:
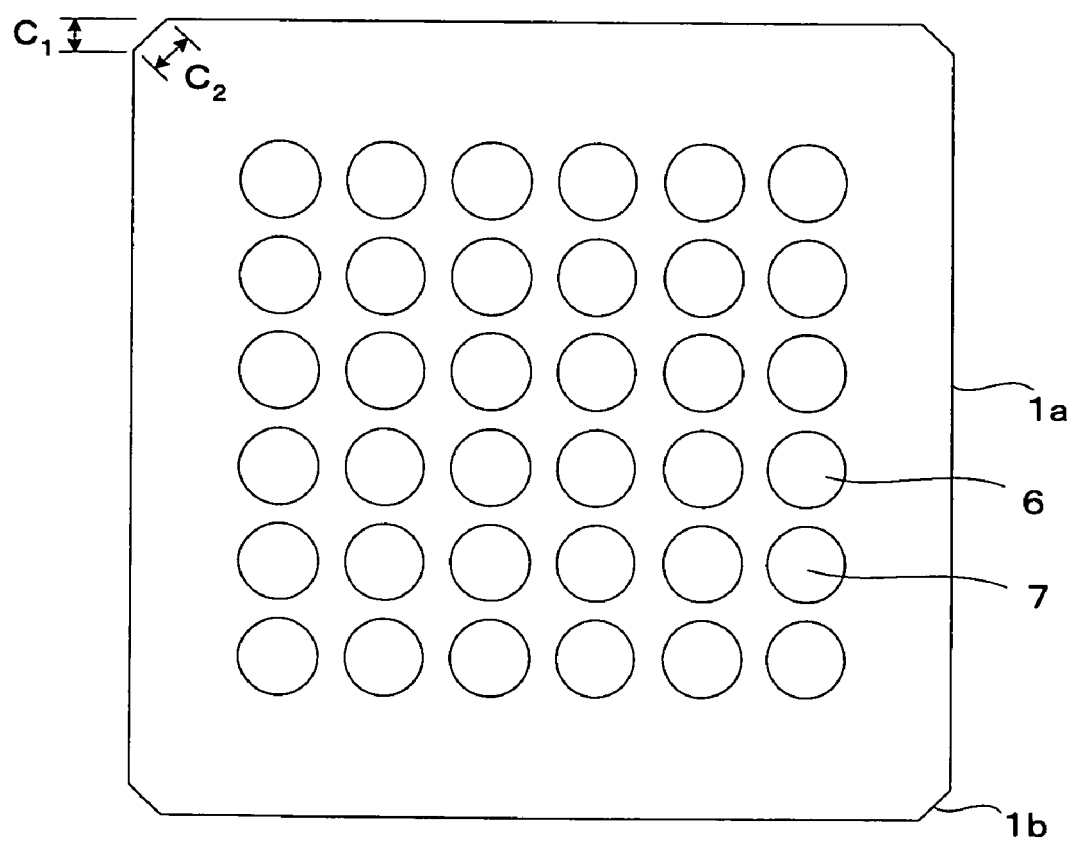
FIG. 3 is a schematic plan view of the capacitor for incorporation in a wiring board in accordance with the first embodiment.

Referring now to the drawings, a description will be given of a first embodiment of the invention. FIG. 1 is a schematic vertical cross-sectional view of a capacitor for incorporation in a wiring board in accordance with this embodiment. FIGS. 2A and 2B are schematic horizontal cross-sectional views of the capacitor for incorporation in a wiring board in accordance with this embodiment. FIG. 3 is a schematic plan view of the capacitor for incorporation in a wiring board in accordance with this embodiment.

A capacitor 1 shown in FIGS. 1 to 3 is a laminated capacitor formed in the shape of a rectangular parallelepiped. The capacitor 1 has a capacitor body 2 constituting the core of the capacitor 1. The capacitor body 2 is comprised of a plurality of ceramic layers 3 (dielectric layers) laminated in the vertical direction, as well as pluralities of inner electrode layers 4 and 5 each disposed between adjacent ones of the ceramic layers 3.

The ceramic layers 3 are constituted of a ceramic material such as a high dielectric constant ceramic, e.g., barium titanate ($BaTiO_3$).

The inner electrode layers 4 (first inner electrodes) and the inner electrode layers 5 (second inner electrodes) are arranged alternately via the ceramic layer 3 in the laminated direction of the ceramic layers 3. The inner electrode layers 4 and the inner electrode layers 5 are electrically insulated from each other by the ceramic layer 3. The total number of the inner electrode layers 4 and 5 is 100 or thereabouts. The inner electrode layers 4 and 5 are mainly constituted of an electrically conductive material such as Ni, but may contain a ceramic material similar to the ceramic material constituting the ceramic layers 3. The thickness of each of the inner electrode layers 4 and 5 is 2 μm or less, for example.

A plurality of outer terminals 6 to 9, which are used as, for example, power supplying electrodes or ground connecting electrodes, are formed on the obverse surface and the reverse surface of the capacitor body 2. It should be noted that the outer terminals 6 to 9 need not be formed on both the obverse surface and the reverse surface of the capacitor body 2, and may be formed on either one of the obverse surface and the reverse surface.

The outer terminals 6 to 9 are mainly constituted of an electrically conductive material such as Ni, but contain a ceramic material similar to the ceramic material constituting the ceramic layers 3. As such a ceramic material is contained in the outer terminals 6 to 9, respectively, it is possible to enhance the adhesion between the ceramic layer 3 and the outer terminals 6 to 9. It should be noted that such a ceramic material may not be contained in the outer terminals 6 to 9.

First plating films (not shown) for improving the adhesion with such as insulating layers 43 and via conductors 60, which will be described later, are respectively formed on the surfaces of the outer electrodes 6 to 9. The first plating films also have the function of preventing the oxidation of the outer electrodes 6 to 9. The first plating films are constituted of an electrically conductive material such as Au or Cu.

Second plating films (not shown) for suppressing a decline in the adhesion between the first plating film and each of the outer electrodes 6 to 9 are respectively formed between the first plating film and each of the outer electrodes 6 to 9. To describe more specifically, if the ceramic material is contained in the outer electrodes 6 to 9, as described above, there is a possibility that the ceramic material is undesirably exposed on the surfaces of the outer electrodes 6 to 9, possibly causing a decline in the adhesion between the first plating film and each of the outer electrodes 6 to 9. The second plating films are formed to suppress such a decline in adhesion. The second plating films are preferably constituted of an electrically conductive material identical to the electrically conductive material which is the principal constituent of, for example, the outer electrodes 6 to 9. It should be noted that the aforementioned second plating films may not be formed in a case where plating treatment can be directly provided to the outer electrodes 6 to 9 with the ceramic material added thereto, and the adhesive strength is high.

Via conductors 10 and 11 are formed in the capacitor body 2 in such a manner as to penetrate the capacitor body 2 from the obverse surface to the reverse surface of the capacitor body 2. It should be noted that the via conductors 10 and 11 are sufficient if they penetrate at least one ceramic layer 3 in the thicknesswise direction of the ceramic layers 3, and may not necessarily penetrate the capacitor body 2.

The via conductors 10 and 11 have upper surfaces respectively connected to the outer electrodes 6 and 7, lower surfaces respectively connected to the outer electrodes 8 and 9, and side surfaces respectively connected to the inner electrode layers 4 or 5. Here, as shown in FIG. 2A, clearance holes 4a are formed in each inner electrode layer 4 in regions where the via conductors 11 penetrate, and the inner electrode layer 4 and the via conductors 11 are electrically insulated. In addition, as shown in FIG. 2B, clearance holes 5a are similarly formed in each inner electrode layer 5 in regions where the via conductors 10 penetrate, and the inner electrode layer 5 and the via conductors 10 are electrically insulated.

The via conductors 10 and 11 are mainly constituted of an electrically conductive material such as Ni, but contain a ceramic material similar to the ceramic material constituting the ceramic layers 3. As such a ceramic material is contained in the via conductors 10 and 11, respectively, it is possible to enhance the adhesion between the ceramic layer 3 and the via conductors 10 and 11. It should be noted that such a ceramic material may not be contained in the via conductors 10 and 11.

Dummy electrode layers 12 and 13 which do not function as electrodes are disposed in the capacitor body 2. Specifically, the dummy electrode layers 12 and 13 are respectively disposed between the ceramic layers 3 and on sides closer to the outer peripheral sides of the ceramic layers 3 than to the inner electrode layers 4 and 5 at predetermined distances from the inner electrode layers 4 and 5.

Each of the dummy electrode layers 12 (first dummy electrode layers) is disposed substantially in the same plane as that of each inner electrode layer 4, while each of the dummy electrode layers 13 (second dummy electrode layers) is disposed substantially in the same plane as that of each inner electrode layer 5. Specifically, each dummy electrode layer 12 is disposed in the same interlayer as that between the ceramic layers 3 where the inner electrode layer 4 is disposed, while each dummy electrode layer 13 is disposed in the same interlayer as that between the ceramic layers 3 where the inner electrode layer 5 is disposed. It should be noted that the dummy electrode layers 12 and 13 may be formed in interlayers different from those between the ceramic layers 3 where the inner electrode layers 4 and 5 are disposed.

The inner electrode layer 4 and the dummy electrode layer 12, as well as the inner electrode layer 5 and the dummy electrode layer 13, are electrically insulated from each other. It should be noted that the ceramic layer 3 has flowed into a gap $S_1$ between the inner electrode layer 4 and the dummy electrode layer 12 and a gap $S_2$ between the inner electrode layer 5 and the dummy electrode layer 13, so that the inner electrode layer 4 and the dummy electrode layer 12, as well as the inner electrode layer 5 and the dummy electrode layer 13, are reliably electrically insulated from each other.

The gap $S_1$ (first gap) between the inner electrode layer 4 and the dummy electrode layer 12 and the gap $S_2$ (second gap) between the inner electrode layer 5 and the dummy electrode layer 13 are in a positional relationship of being offset from each other in the laminated direction of the ceramic layers 3. It should be noted that the gaps $S_1$ each located between the inner electrode layer 4 and the dummy electrode layer 12 are aligned in the laminated direction of the ceramic layers 3, while the gaps $S_2$ each located between the inner electrode layer 5 and the dummy electrode layer 13 are also aligned in the laminated direction of the ceramic layers 3.

It is preferred that the width $w_1$ (including the width $w_{1a}$ and the width $w_{1b}$ which will be described later) of the gap $S_1$ (including a gap $S_{1a}$ and a gap $S_{1b}$ which will be described later) and the width $w_2$ (including the width $w_{2a}$ and the width $w_{2b}$ which will be described later) of the gap $S_2$ (including a gap $S_{2a}$ and a gap $S_{2b}$ which will be described later) should be respectively 50 μm or more. The reason that the width $w_1$ of the gap $S_1$ and the width $w_2$ of the gap $S_2$ are defined as described above is that if these widths are less than 50 μm, there is a possibility that the ceramic green sheets 23 and 26, which will be described later, fail to be filled into the gaps $S_1$ and $S_2$ during the lamination of the ceramic green sheets 23 and 26, possibly causing delamination.

The dummy electrode layers 12 and 13 are formed in such a manner as to surround the inner electrode layers 4 and 5. Here, the dummy electrode layers 12 are formed by using a printing method such as screen printing, as will be described later. It is preferred that, of the gaps $S_1$, the width $w_{1a}$ of the gap $S_{1a}$ extending in a direction perpendicular to the printing direction of the dummy electrode layer 12 and the width $w_{1b}$ of the gap $S_{1b}$ extending in a direction parallel to the printing direction of the dummy electrode layer 12 should respectively be 50 to 350 μm, and that the width $w_{1a}$ of the gap $S_{1a}$ should be equal to or greater than the width $w_{1b}$ of the gap $S_{1b}$. The reason that the width $w_{1a}$ of the gap $S_{1a}$ and the width $w_{1b}$ of the gap $S_{1b}$ are respectively set to 50 to 350 μm is that if these widths are less than 50 μm, there are cases where blurring can occur in the gap $S_{1a}$ and the gap $S_{1b}$ during printing, in which case there is a possibility that reliability cannot be ensured. On the other hand, if these widths exceed 350 μm, the area for forming the capacitor becomes small, impairing the electric characteristics. In addition, the reason that the width $w_{1a}$ of the gap $S_{1a}$ is set to be equal to or greater than the width $w_{1b}$ of the gap $S_{1b}$ is to form a pattern which has less burring and the like in terms of the characteristics of printing.

The dummy electrode layers 13 are also similarly formed by using a printing method such as screen printing, as will be described later. For the same reasons as described above, of the gaps $S_2$, the width $w_{2a}$ of the gap $S_{2a}$ extending in the direction perpendicular to the printing direction of the dummy electrode layer 13 and the width $w_{2b}$ of the gap $S_{2b}$ extending in the direction parallel to the printing direction of the dummy electrode layer 13 should preferably be respectively set to be 50 to 350 μm, and the width $w_{2a}$ of the gap $S_{2a}$ should preferably be equal to or greater than the width $w_{2b}$ of the gap $S_{2b}$.

Outer peripheral surfaces 12a and 13a of the dummy electrode layers 12 and 13 are exposed from between the ceramic layers 3. Here, if consideration is given to the alleviation of steps which are formed in the vicinities of the end portions of the capacitor 1, it is preferred that the all the outer peripheral surfaces 12a and 13a of the dummy electrode layers 12 and 13 should be exposed from between the ceramic layers 3, but only portions of the outer peripheral surfaces 12a and 13a may be exposed. The lengths of the outer peripheries of the dummy electrode layers 12 and 13 should preferably be not less than 80% of the length of the outer periphery of the ceramic layer 3.

Portions of the dummy electrode layers 12 overlap with portions of the dummy electrode layers 13 and the inner electrode layers 5 in the laminated direction of the ceramic layers 3. Here, the width $w_3$ of the overlapping portion between the dummy electrode layer 12 and the dummy electrode layer 13 should preferably be equal to or greater than the width $w_4$ of the overlapping portion between the dummy electrode layer 12 and the inner electrode layer 5 in the laminated direction of the ceramic layers 3. It should be noted that although in this embodiment a description has been given of the example in which portions of the dummy electrode layers 12 overlap with portions of the inner electrode layers 5 in the laminated direction of the ceramic layers 3, portions of the dummy electrode layers 13 may overlap with portions of the inner electrode layers 4 in the laminated direction of the ceramic layers 3. In this case, the width of the overlapping portions between the dummy electrode layers 12 and the dummy electrode layers 13 in the laminated direction of the ceramic layers 3 should preferably be equal to or greater than the width of the overlapping portions between the dummy electrode layers 13 and the inner electrode layers 4 in the laminated direction of the ceramic layers 3.

The width $w_3$ of the overlapping portion between the dummy electrode layer 12 and the dummy electrode layer 13 in the laminated direction of the ceramic layers 3 should preferably be equal to or greater than 100 μm. The reason that the width $w_3$ is defined as described above is that if it is less than 100 μm, there is a possibility that end portions of the capacitor assume a shape in which they suddenly rise up, with the result that the steps formed at the end portions of the capacitor are not sufficiently alleviated, possibly causing the resin filler to undesirably enter the reverse side of the capacitor.

If consideration is given to the alleviation of steps which are formed in the vicinities of the end portions of the capacitor 1, the total number of the inner electrode layers 4 and 5 should preferably be equal to or greater than a half (50 layers or thereabouts) of the total number of the inner electrode layers 4 and 5, more preferably approximately identical (100 layers or thereabouts) to the total number of the inner electrode layers 4 and 5.

The dummy electrode layers 12 and 13 are constituted of an electrically conductive material. However, if consideration is given to the effect during the firing of such as the ceramic green sheets 23 and 26 and their formation step, which will be described later, the electrically conductive material constituting the dummy electrode layers 12 and 13 should preferably be the same material as that of the electrically conductive material constituting the inner electrode layers 4 and 5. In addition, for similar reasons, the thickness of each of the dummy electrode layers 12 and 13 should preferably be substantially identical (e.g., 2 μm or less) to the thickness of each of the inner electrode layers 4 and 5.

It should be noted that, as shown in FIG. 3, a flat-shaped chamfered portion 1b with a chamfer dimension $C_1$ of 0.6 mm or more is formed at each of the four corners of outer peripheral surfaces 1a of the capacitor 1. Here, the outer peripheral surfaces 1a of the capacitor 1 refer to side surfaces other than the surfaces where the outer terminals 6 to 9 are formed in the capacitor 1. Specifically, the outer peripheral surfaces 1a of the capacitor 1 are constituted by outer peripheral surfaces 3a of the ceramic layers 3 and outer peripheral surfaces 12a and 13a of the dummy electrode layers 12 and 13. The chamfer dimension $C_1$ is the length shown in FIG. 3. The chamfer dimension $C_1$ may be actually measured, but can also be determined from a chamfer surface length $C_2$. The chamfer surface length $C_2$ is the length of a line segment shown in FIG. 3, and a value in which the chamfer surface length $C_2$ is divided by $\sqrt{2}$ is the chamfer dimension $C_1$.

The chamfer dimension $C_1$ is desirably not less than 0.8 mm and not more than 1.2 mm from the viewpoint of the fabrication of the capacitor. It should be noted that, instead of or together with the chamfered portion 1b, a rounded portion of 0.6 mm or more may be formed at at least one corner of the outer peripheral surface 1a of the capacitor 1. In this case, the radius of curvature of the rounded portion is desirably not less than 0.8 mm and not more than 1.2 mm from the viewpoint of the fabrication of the capacitor.

Figure 4A:
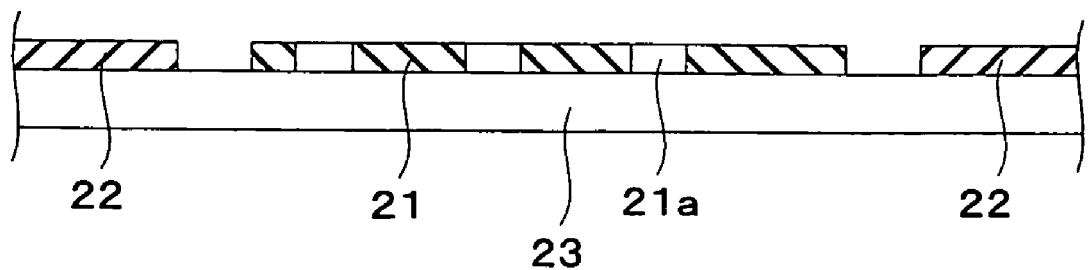
FIGS. 4A and 4B are a cross-sectional view and a plan view schematically illustrating the process of manufacturing a capacitor for incorporation in a wiring board in accordance with the first embodiment.
Figure 4B:
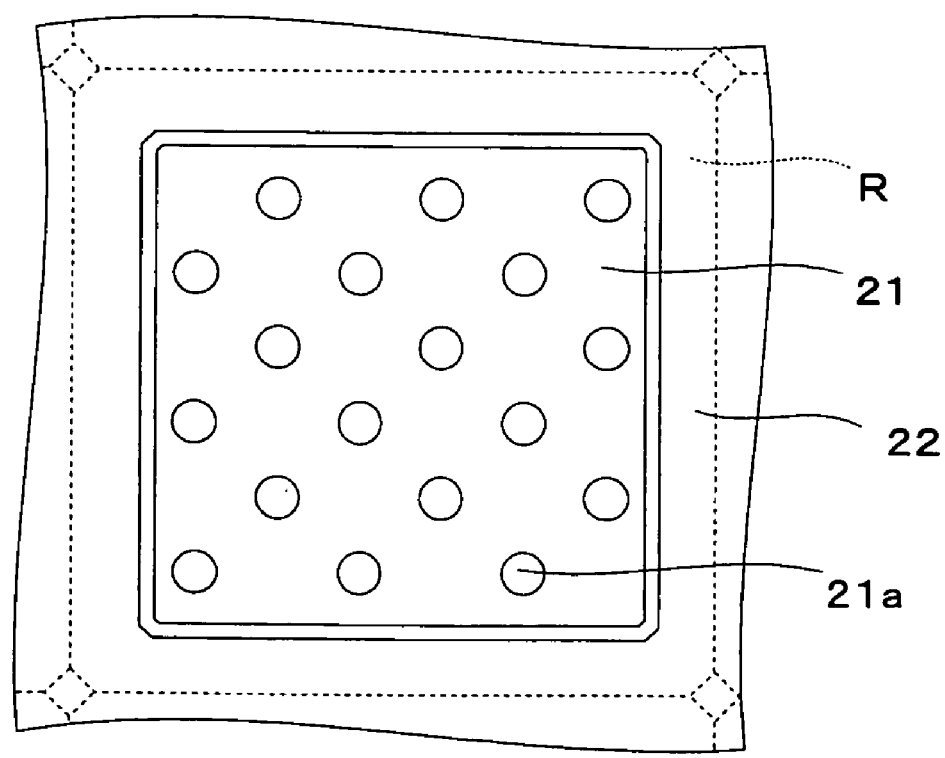
Figure 5A:
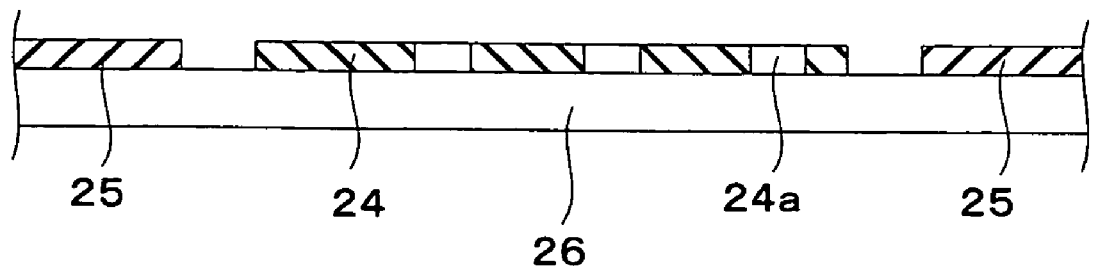
FIGS. 5A and 5B are a cross-sectional view and a plan view schematically illustrating the process of manufacturing a capacitor for incorporation in a wiring board in accordance with the first embodiment
Figure 5B:
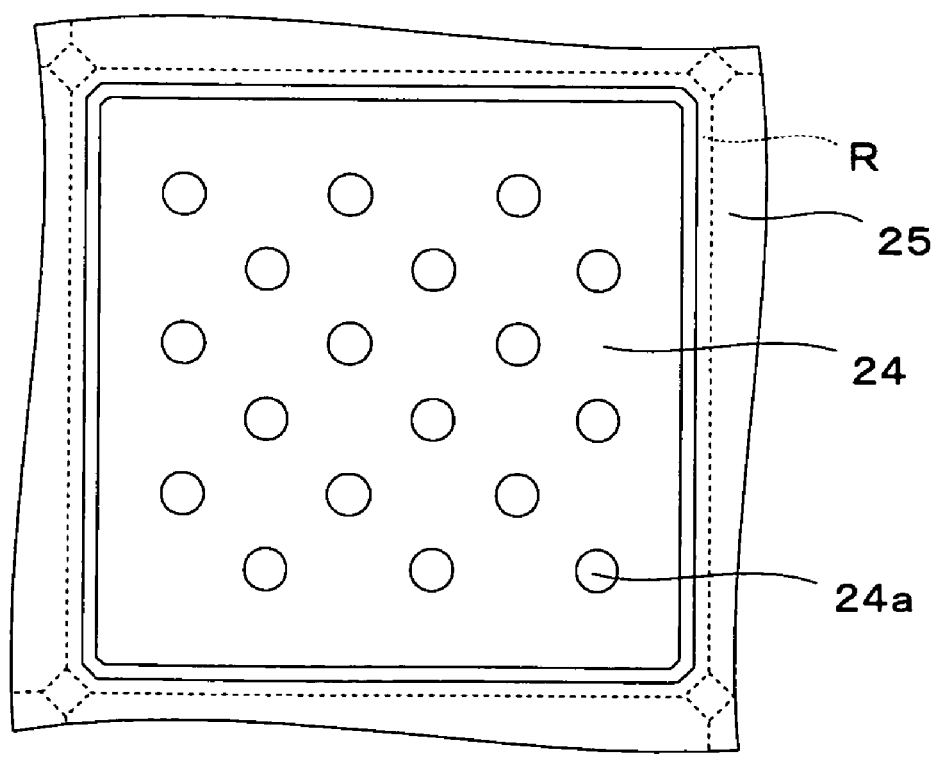
Figure 6A:
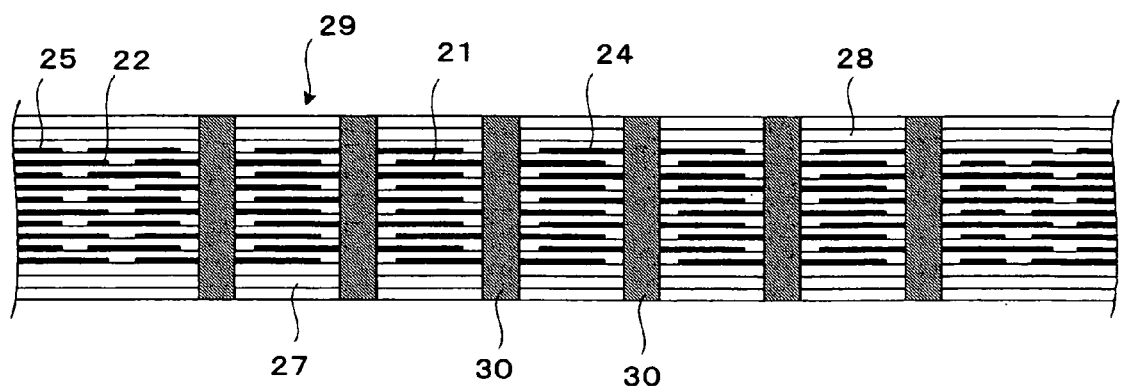
FIGS. 6A and 6B are cross-sectional views schematically illustrating the process of manufacturing a capacitor for incorporation in a wiring board in accordance with the first embodiment.
Figure 6B:
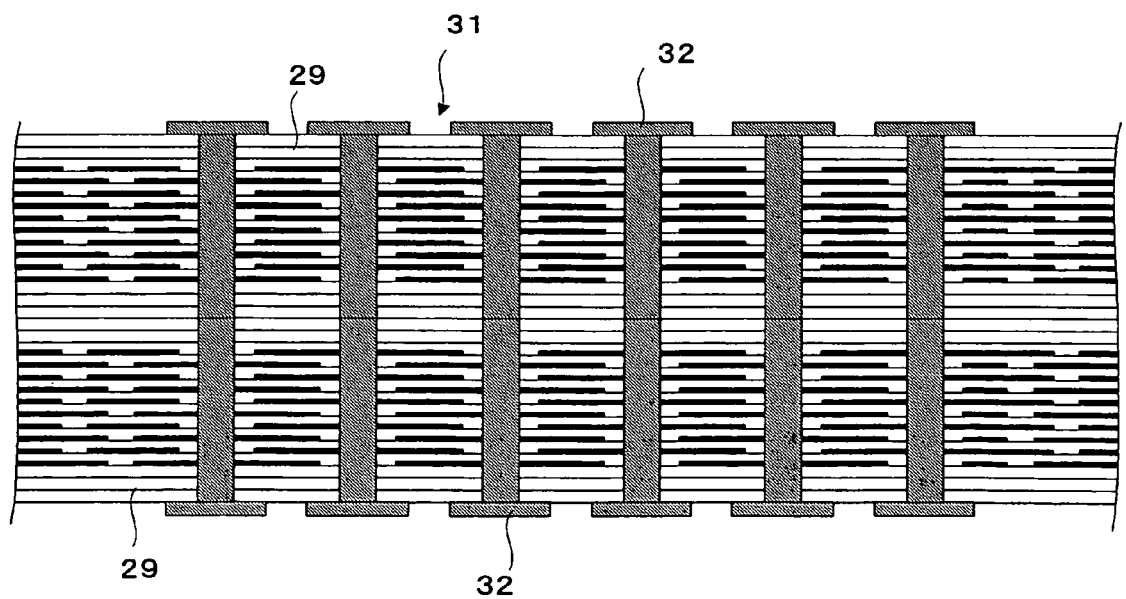
Figure 7A:
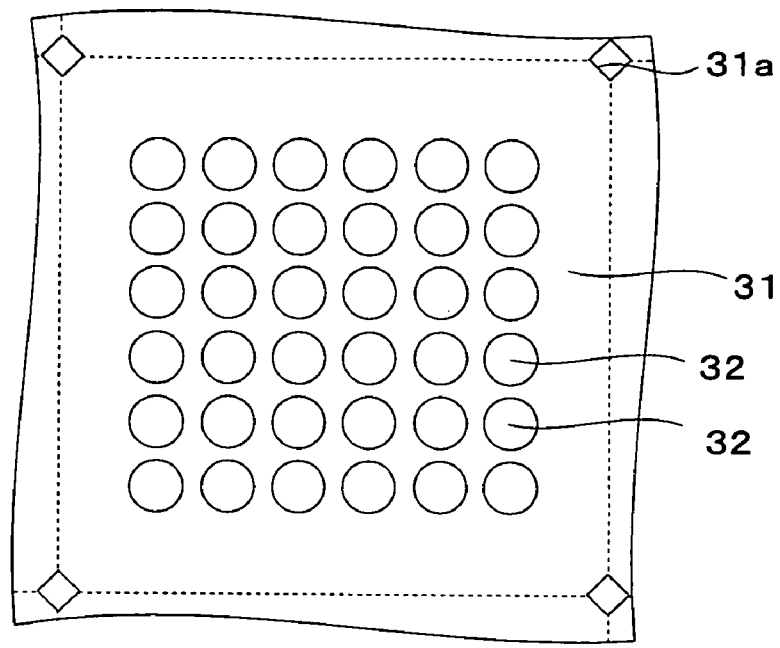
FIGS. 7A and 7B are plan views schematically illustrating the process of manufacturing a capacitor for incorporation in a wiring board in accordance with the first embodiment
Figure 7B:
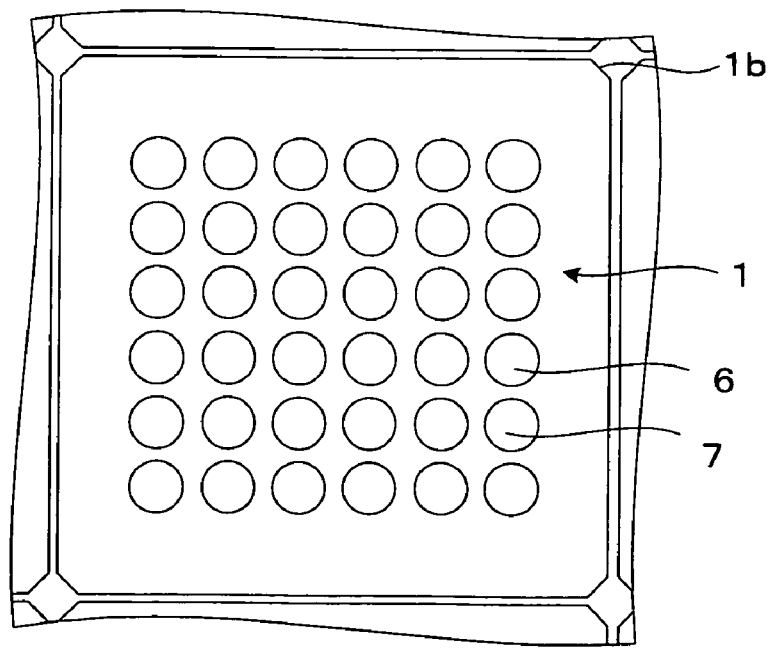

The capacitor 1 can be fabricated by the following procedure, for example. It should be noted that in this embodiment a description will be given of a process in which a plurality of capacitors 1 are fabricated at one time. FIGS. 4A and 4B are a cross-sectional view and a plan view schematically illustrating the process of manufacturing a capacitor for incorporation in a wiring board in accordance with this embodiment. FIGS. 5A and 5B are a cross-sectional view and a plan view schematically illustrating the process of manufacturing a capacitor for incorporation in a wiring board in accordance with this embodiment. FIGS. 6A and 6B are cross-sectional views schematically illustrating the process of manufacturing a capacitor for incorporation in a wiring board in accordance with this embodiment. FIGS. 7A and 7B are plan views schematically illustrating the process of manufacturing a capacitor for incorporation in a wiring board in accordance with this embodiment.

The plurality of ceramic green sheets 23 (dielectric sheets) are prepared on each of which inner electrode patterns 21 serving as the inner electrode layers 4 after firing and dummy electrode patterns 22 serving as the dummy electrode layers 12 after firing have been formed on the surface by such as screen printing, and which serve as the ceramic layers 3 after firing (FIGS. 4A and 4B).

The plurality of ceramic green sheets 26 (dielectric sheets) are prepared on each of which inner electrode patterns 24 serving as the inner electrode layers 5 after firing and dummy electrode patterns 25 serving as the dummy electrode layers 13 after firing have been formed on the surface by such as screen printing, and which serve as the ceramic layers 3 after firing (FIGS. 5A and 5B).

In this embodiment, since the plurality of capacitors 1 are fabricated at one time, the plurality of inner electrode patterns 21 and the plurality of dummy electrode patterns 22 are formed on the surface of each ceramic green sheet 23, and the plurality of inner electrode patterns 24 and the plurality of dummy electrode patterns 25 are formed on the surface of each ceramic green sheet 26. Here, the broken lines shown in FIGS. 4B and 5B indicate boundary lines of the individual capacitors, and the outer peripheries of the dummy electrode patterns 22 and 25 are formed up to these boundary lines. It should be noted that the dummy electrode patterns 22 and 25 are formed integrally with the adjacent dummy electrode patterns 22 and 25.

Each of the inner electrode patterns 21 and 24 is formed within a region (hereafter, this region will be referred to as the "capacitor formation region") R which is surrounded by the broken lines shown in FIGS. 4B and 5B. Clearance holes 21a and 24a serving as the clearance holes 4a and 5a are formed in the inner electrode patterns 21 and 24.

The dummy electrode patterns 22 and 25 are respectively formed on sides closer to the outer peripheral sides of the ceramic green sheets 23 and 26 than to the inner electrode patterns 21 and 24 at predetermined distances from the inner electrode patterns 21 and 24 in such a manner as to surround the inner electrode patterns 21 and 24. Inner peripheries of each of the dummy electrode patterns 22 and 25 are located in the capacitor formation region R.

The dummy electrode patterns 22 and 25 may be formed in a process different from the process for forming the inner electrode patterns 21 and 24, but are preferably formed in the same process as the process for forming the inner electrode patterns 21 and 24 in the light of efficiency.

Next, the ceramic green sheets 23 each having the inner electrode patterns 21 and the like formed thereon and the ceramic green sheets 26 each having the inner electrode patterns 24 and the like formed thereon are alternately laminated on a cover layer 27 formed by laminating a predetermined number of ceramic green sheets. A cover layer 28 formed in the same procedure as that of the cover layer 27 is further laminated thereon, and these laminated members are subjected to pressurization to form a laminated body 29. Subsequently, via holes penetrating from the obverse surface to the reverse surface of the laminated body 29 are formed, and conductive paste is press fitted into the via holes, thereby forming via conductor paste 30 serving as the via conductors 10 and 11 after firing (FIG. 6A).

Next, another laminated body 29 formed in a similar procedure is superposed on the laminated body 29 with the via conductor paste 30 formed thereon, and this superposed assembly is subjected to pressurization to form a laminated body 31. Subsequently, outer terminal patterns 32 connected to the via conductor paste 30 and serving as the outer electrode terminals 6 to 9 after firing are formed on the obverse surface and the reverse surface of the laminated body 31 by such as screen printing (FIG. 6B).

After the formation of the outer terminal patterns 32, the ceramic green sheets 23 and 26 and portions of the dummy electrode patterns 22 and 25 which serve as the corners of the capacitors 1 are punched into rectangular shapes by such as punching to thereby form portions 31a serving as the chamfered portions 1b (FIG. 7A). Further, break grooves are formed along the broken lines shown in FIG. 7A by a laser or the like.

Subsequently, these are degreased and are fired at a predetermined temperature for a predetermined time. As a result of this firing, the ceramic green sheets 23 and the like are sintered, and the ceramic layers 3 are thereby formed. Also, the inner electrode patterns 21 and the like are sintered, and the inner electrode layers 4 and the like are thereby formed.

After firing, the second plating films are respectively formed on the surfaces of the outer electrodes 6 and 9 by such as electroless plating, and the first plating films are further formed on the surfaces of the second plating films by such as electroless plating. It should be noted that the aforementioned second plating films may not be formed in the case where plating treatment can be directly provided to the outer electrodes 6 and 9 with the ceramic material added thereto, and the adhesive strength is high.

Then, the adjacent capacitors 1 are finally cut off along the broken lines shown in FIG. 7A (FIG. 7B). As a result, a plurality of capacitors 1 shown in FIG. 1 are fabricated.

Figure 8:
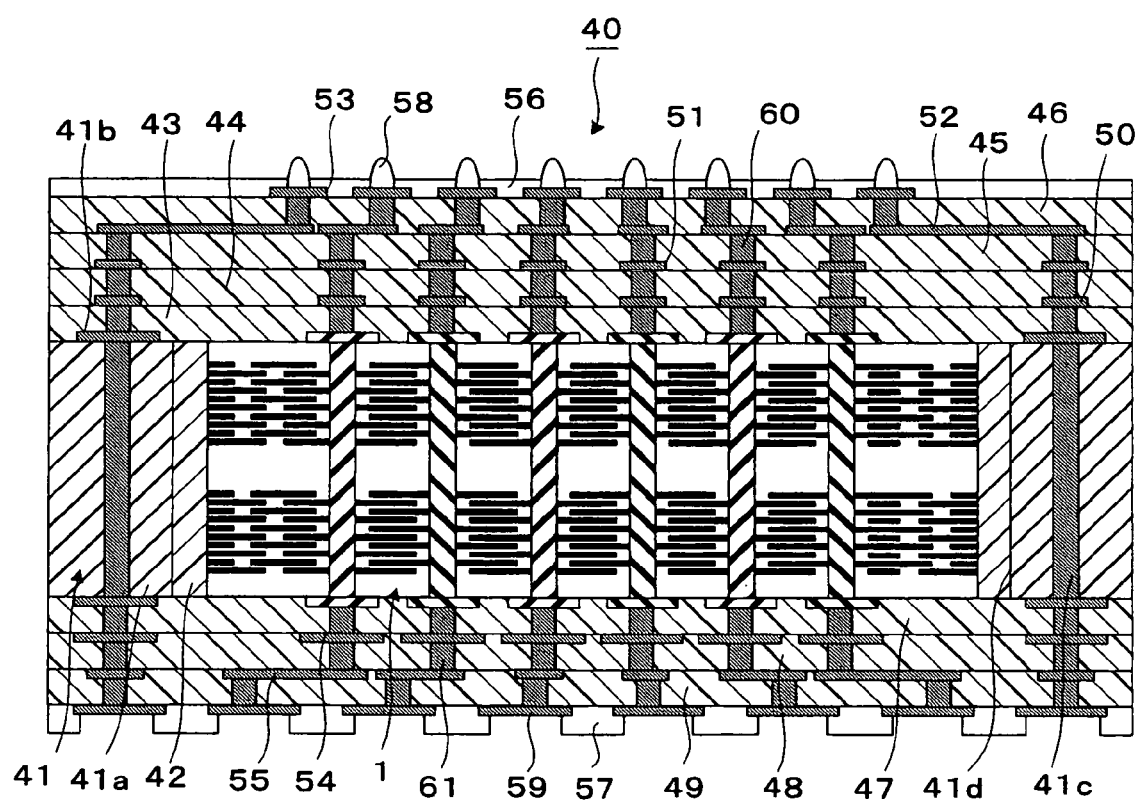
FIG. 8 is a schematic vertical cross-sectional view of a wiring board in which the capacitor for incorporation in a wiring board in accordance with the first embodiment is incorporated.

The capacitor 1 is used by being incorporated in a wiring board. Hereafter, a description will be given of a wiring board incorporating the capacitor 1. FIG. 8 is a schematic vertical cross-sectional view of a wiring board in which the capacitor for incorporation in a wiring board in accordance with this embodiment is incorporated.

A wiring board 40 shown in FIG. 8 is an organic board which is formed in the shape of a rectangular parallelepiped. The wiring board 40 is mainly constituted of a polymeric material which is reinforced by using ceramic particles or fibers as fillers.

The wiring board 40 has a core board 41 as a wiring board body constituting the core of the wiring board 40. The core board 41 is comprised of a core material 41a formed of such as a glass-epoxy resin composite material, as well as wiring layers 41b which are respectively formed on both surfaces of the core material 41a, have desired patterns, and are formed of such as Cu.

A plurality of through holes are formed in the core board 41 in such a manner as to penetrate in the vertical direction of the core board 41. A through hole conductor 41c which is electrically connected to the wiring layers 41b is formed in each through hole.

An opening 41d, for example, which serves as a capacitor accommodating portion for accommodating the capacitor 1, is formed in a central portion of the core board 41. The opening 41d is formed in the shape of, for example, a rectangular parallelepiped which is larger than the capacitor 1. The capacitor 1 is accommodated in the opening 41d. It should be noted that the capacitor accommodating portion of the core board 41 is not limited to the opening 41d and may be a recessed portion.

Rounded portions with a radius of curvature of not less than 0.1 mm and not more than 2 mm or chamfered portions with a chamfer dimension of not less than 0.1 mm and not more than 2 mm are respectively formed at the four corner portions on the inner side surfaces of the core board 41.

A resin filler 42 serving as the filler and constituted of such as a polymeric material is filled in the gaps between the core board 41 and the capacitor 1, and the capacitor 1 is fixed to the core board 41 by means of this resin filler 42.

Here, the filling of the resin filler 42 into the gaps between the core board 41 and the capacitor 1 is performed in a state in which an adhesive tape is adhered to the reverse surface of the core board 41, the capacitor 1 is then disposed in the opening 41d of the core board 41 to allow the reverse surface of the capacitor 41 to adhere to the adhesive tape, and the position of the capacitor 1 with respect to the core board 41 is thereby fixed by the adhesive tape. It should be noted that the resin filler 42 also has the function of absorbing the difference in thermal expansion in the planar direction and the thicknesswise direction of the core board 41 and the capacitor 1 by its own resilient deformation.

Buildup wiring layers are respectively formed on the obverse surface sides of the core board 41 and the capacitor 1 and on the reverse surface sides of the core board 41 and the capacitor 1. The buildup wiring layer has insulating layers 43 to 49 formed of a thermosetting resin such as an epoxy resin. Wiring layers 50 to 55 constituted of a conductive material such as Cu are each formed between the insulating layers 43 and 44 and other adjacent ones of the insulating layers.

The obverse surface of the insulating layer 46 and the reverse surface of the insulating layer 49 are respectively covered with solder resists 56 and 57 constituted of such as a photosensitive resin composition. Openings are formed in the solder resists 56 and 57, and terminals 58 for electrically connecting to a semiconductor chip (not shown) and terminals 59 for connecting to such as a main board (not shown) are exposed from these openings. The outer electrodes 6 and 7, the wiring layers 41b, and the like are electrically connected to the terminals 58 via the via conductors 60 and the like, while the outer electrodes 8 and 9, the wiring layers 41b, and the like are electrically connected to the terminals 59 via via conductors 61 and the like.

In this embodiment, since the dummy electrodes 12 and 13 are respectively formed on sides closer to the outer peripheral sides of the ceramic layers 3 than to the inner electrode layers 4 and 5, it is possible to enlarge the thickness of the end portions of the capacitor 1, thereby making it possible to provide the capacitor 1 in which the steps formed in the vicinities of the end portions of the capacitor are alleviated. Hence, when the resin filler 42 is filled into the gaps between the core board 41 and the capacitor 1, the resin filler 42 becomes difficult to flow onto the reverse surface side of the capacitor 1. As a result, since the resin filler 42 becomes difficult to come into contact with the outer terminals 8 and 9 disposed on the reverse surface of the capacitor 1, it is possible to reduce faulty conduction. It should be noted that in a case where the distance from the obverse surfaces of the outer terminals 6 and 7 to the reverse surfaces of the outer terminals 8 and 9 was, for example, 0.87 mm, when the dummy electrode layers 12 and 13 were not formed, the steps in the vicinities of the capacitor were 40 to 50 μm, whereas when the dummy electrode layers 12 and 13 were formed, the steps in the vicinities of the capacitor were alleviated to 10 μm or thereabouts.

In this embodiment, since the dummy electrode layers 12 and 13 are formed at predetermined intervals with the inner electrode layers 4 and 5, when the first and second plating films are formed on the outer terminals 6 to 9, even if a plating solution is adhered to the dummy electrode layers 12 and 13, the plating solution is difficult to adhere to the inner electrode layers 4 and 5. Hence, the inner electrode layers 4 and 5 are difficult to be electrically short-circuited, thereby making it possible to reduce faulty conduction.

In a case where the gaps $S_1$ each located between the inner electrode layer 4 and the dummy electrode layer 12 and the gaps $S_2$ each located between the inner electrode layer 5 and the dummy electrode layer 13 overlap in the laminated direction of the ceramic layers 3, unfavorably there exist portions where both the inner electrode layers 4 and 5 and the dummy electrode layers 12 and 13 are not present. Since the inner electrode layers 4 and 5 and the dummy electrode layers 12 and 13 are not present in these portions, the thickness becomes thinner than the remaining portions, so that these portions assume a shape in which they are locally recessed. If these recesses are formed at portions which are relatively close to outer peripheries of the capacitor 1, there is a possibility of the resin filler 42 flowing onto the reverse surface side of the capacitor 1. In contrast, since the gaps $S_1$ each located between the inner electrode layer 4 and the dummy electrode layer 12 and the gaps $S_2$ each located between the inner electrode layer 5 and the dummy electrode layer 13 do not overlap in the laminated direction of the ceramic layers 3, it is difficult for such localized recesses to be formed, thereby making it possible to further reduce faulty conduction.

In this embodiment, since the chamfered portion 1b with a chamfer dimension $C_1$ of 0.6 mm or more is formed at each corner of the outer peripheral surfaces 1a of the capacitor 1, it is difficult for the thermal stress to be concentrated at the corner portions of the resin filler 42 on the capacitor 1 side, so that it is possible to suppress the occurrence of cracks at the corner portions of the resin filler 42 on the capacitor 1 side. It should be noted that even in a case where a rounded portion 1c with a radius of curvature of 0.6 mm or more is formed at each corner of the outer peripheral surfaces 1a of the capacitor 1, it is possible to obtain an advantage similar to that of the chamfered portion 1b.

In this embodiment, since the chamfered portion 1b or the rounded portion is formed at each corner of the outer peripheral surfaces 1a of the capacitor 1, the distance from the ceramic layer 3 to a signal line which is present in the vicinity of the corner of the capacitor 1 becomes large as compared with a case where the chamfered portion 1b or the rounded portion is not formed. As a result, it is possible to reduce a signal delay of a signal line which is present in the vicinity of the corner of the capacitor 1.

Second Embodiment

Figure 9:
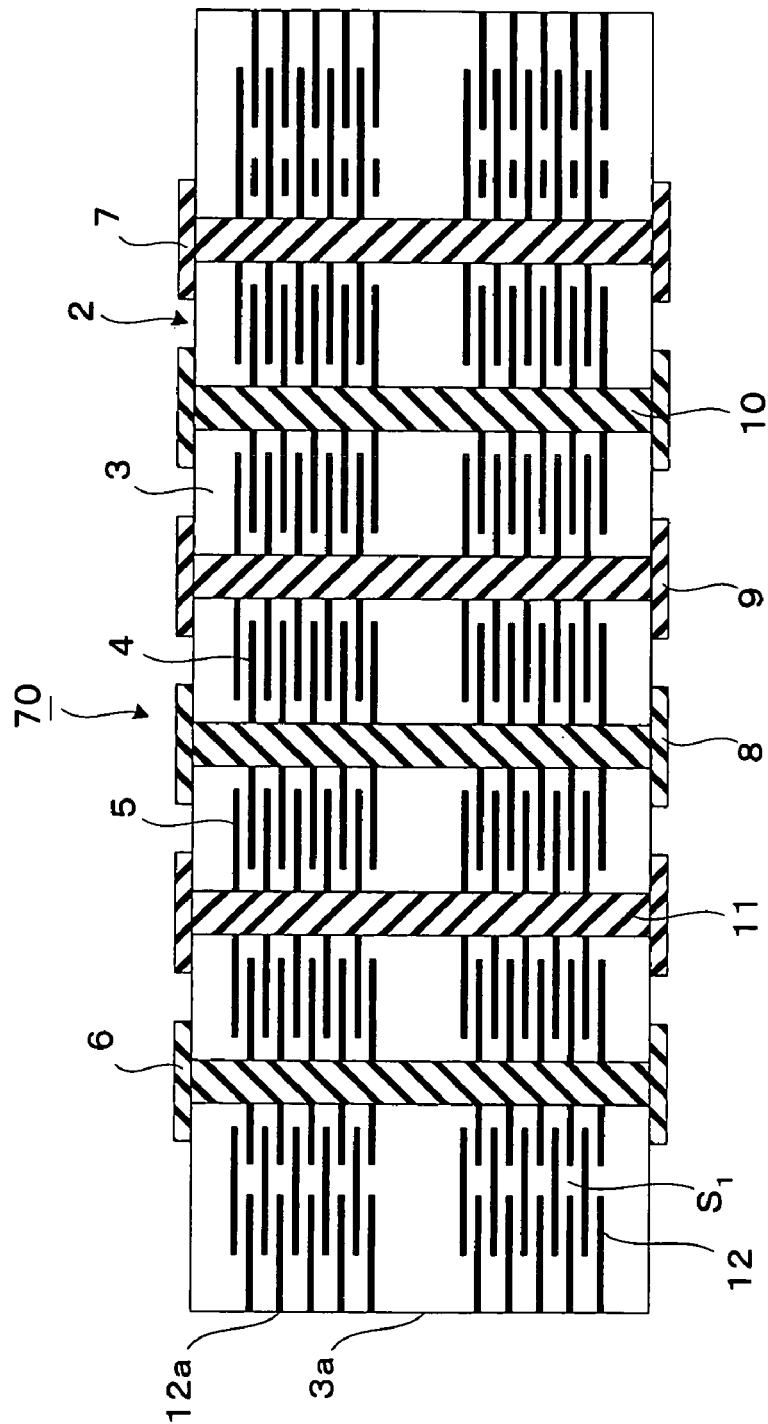
FIG. 9 is a schematic vertical cross-sectional view of the capacitor for incorporation in a wiring board in accordance with a second embodiment.

Referring now to the drawings, a description will be given of a second embodiment of the invention. In this embodiment, a description will be given of an example in which the dummy electrode layer is disposed so as to be set in substantially the same plane as that of either one of the first inner electrode layer and the second inner electrode layer. It should be noted that, in this embodiment and the ensuing embodiments, identical members to those described in the first embodiment will be denoted by the same reference numerals, and the contents which overlap with the contents described in the first embodiment are omitted in some cases. FIG. 9 is a schematic vertical cross-sectional view of the capacitor for incorporation in a wiring board in accordance with this embodiment.

As shown in FIG. 9, in a capacitor 70 in accordance with this embodiment, the dummy electrode layers 12 are disposed, but electrode layers corresponding to the dummy electrode layers 13 in the first embodiment are not disposed. It should be noted that the outer peripheral surface of the inner electrode layer 5 is not exposed from between the ceramic layers 3.

In this embodiment, since the dummy electrode layers 12 are disposed on the outer peripheral sides of the inner electrode layers 4, it is possible to obtain advantages similar to those described in the first embodiment. It should be noted that the dummy electrode layers 13 corresponding to the first embodiment may be disposed without disposing the dummy electrode layers 12 shown in FIG. 9, and advantages similar to those of this embodiment can be obtained in this case as well.

Third Embodiment

Figure 10:
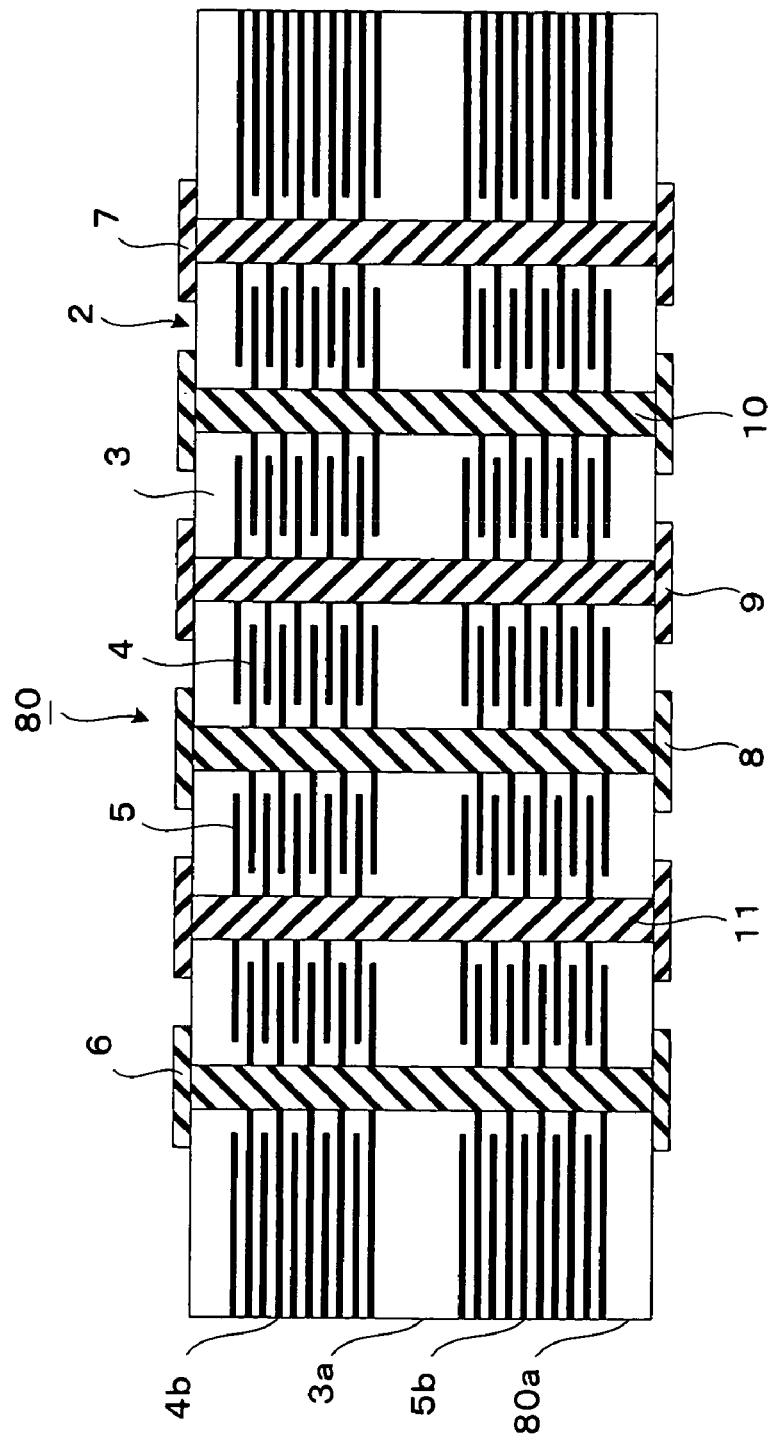
FIG. 10 is a schematic vertical cross-sectional view of the capacitor for incorporation in a wiring board in accordance with a third embodiment.
Figure 11A:
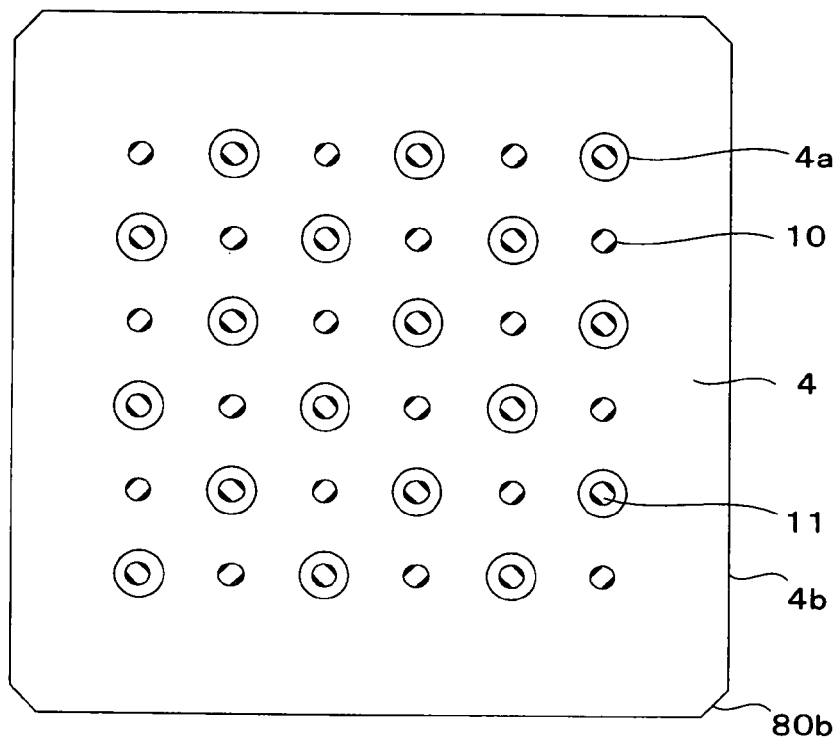
FIGS. 11A and 11B are schematic horizontal cross-sectional views of the capacitor for incorporation in a wiring board in accordance with the third embodiment.
Figure 11B:
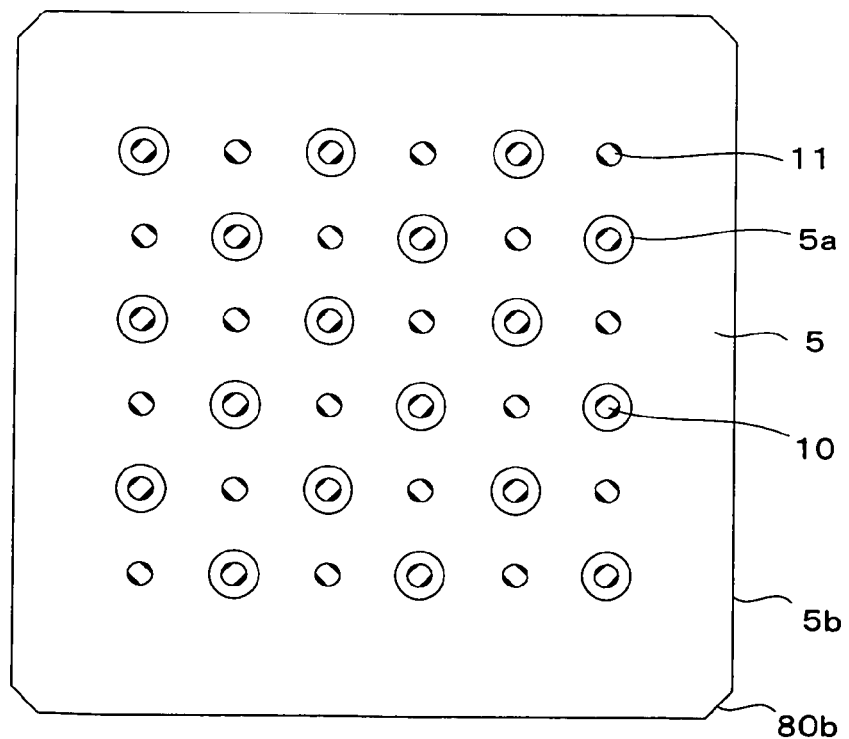

Referring now to the drawings, a description will be given of a third embodiment of the invention. In this embodiment, a description will be given of an example in which the dummy electrode layers are not formed, and all the outer peripheral surfaces of the inner electrode layers are exposed from between the ceramic layers in almost all of the inner electrode layers. FIG. 10 is a schematic vertical cross-sectional view of the capacitor for incorporation in a wiring board in accordance with this embodiment. FIGS. 11A and 11B are schematic horizontal cross-sectional views of the capacitor for incorporation in a wiring board in accordance with this embodiment.

As shown in FIGS. 10 to 11B, in a capacitor 80 in accordance with this embodiment, almost all of outer peripheral surfaces 4b and 5b of almost all of the inner electrode layers 4 and 5 are exposed from between the ceramic layers 3. In addition, in this embodiment as well, chamfered portions 80b are formed at outer peripheral surfaces 80a of the capacitor 80, but in this embodiment the outer peripheral surfaces 80a of the capacitor 80 are constituted by the outer peripheral surfaces 3a of the ceramic layers 3 and the outer peripheral surfaces 4b and 5b of the inner electrode layers 4 and 5.

Figure 12A:
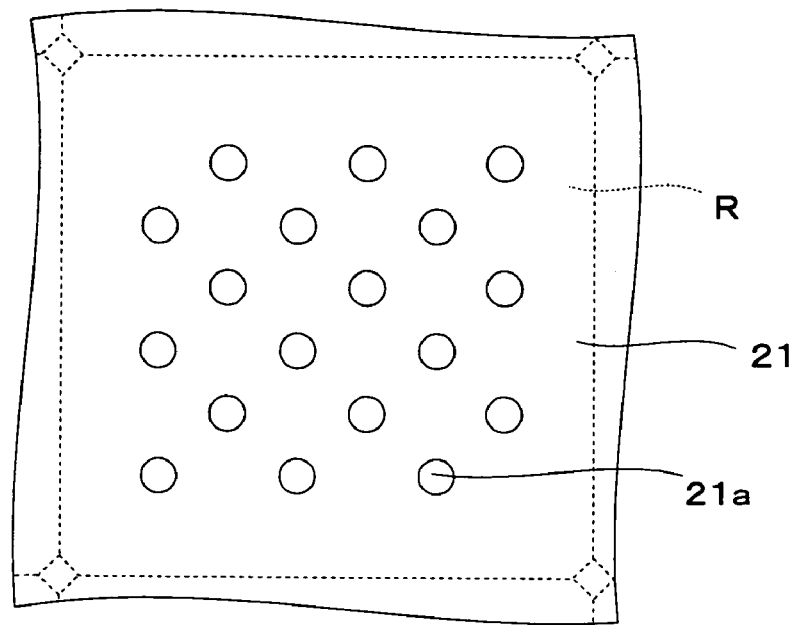
FIGS. 12A and 12B are plan views schematically illustrating the process of manufacturing a capacitor for incorporation in a wiring board in accordance with the third embodiment.
Figure 12B:
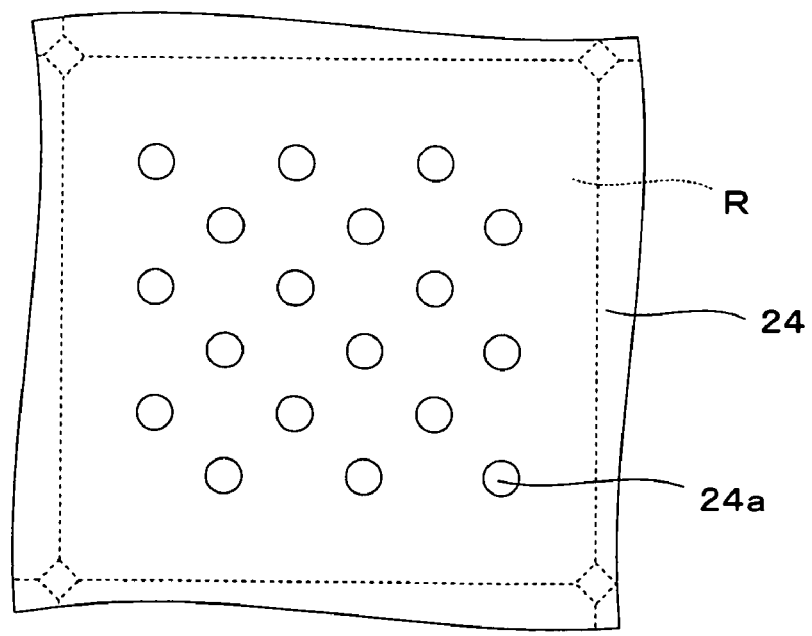

The capacitor 80 can be fabricated by the following procedure, for example. FIGS. 12A and 12B are plan views schematically illustrating the process of manufacturing a capacitor for incorporation in a wiring board in accordance with this embodiment.

The capacitor in accordance with this embodiment can be fabricated by a procedure substantially similar to the procedure described in the above-described first embodiment. However, as shown in FIGS. 12A and 12B, the dummy electrode layers 22 and 25 in the first embodiment are not formed on the surfaces of the ceramic green sheets 23 and 26, and the outer peripheries of the inner electrode patterns 21 and 24 are formed up to the boundary lines of the capacitor. It should be noted that the inner electrode patterns 21 and 24 are formed integrally with the adjacent inner electrode patterns 21 and 24.

In this embodiment, since almost all of the outer peripheral surfaces 4b and 5b of almost all of the inner electrode layers 4 and 5 are exposed from between the ceramic layers 3, it is possible to obtain advantages similar to those described in the first embodiment.

Fourth Embodiment

Referring now to the drawings, a description will be given of a fourth embodiment of the invention. In this embodiment, a description will be given of an example in which a ceramic pattern is formed on the surface of a ceramic green sheet different from the ceramic green sheet on which the inner electrode pattern is formed and at positions corresponding to the clearance holes.

Figure 13A:
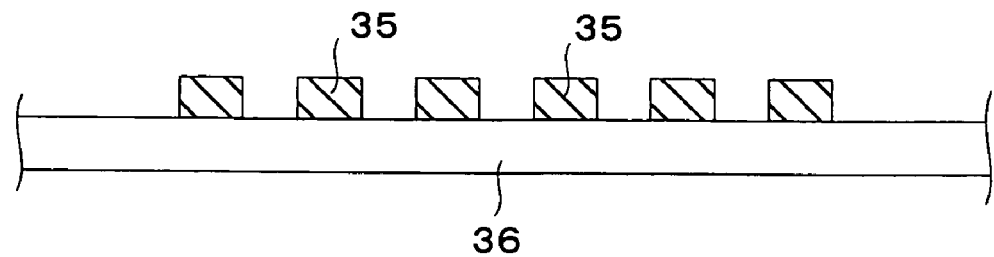
FIGS. 13A and 13B are a side elevational view and a plan view of a ceramic green sheet with a ceramic pattern formed thereon in accordance with a fourth embodiment.
Figure 13B:
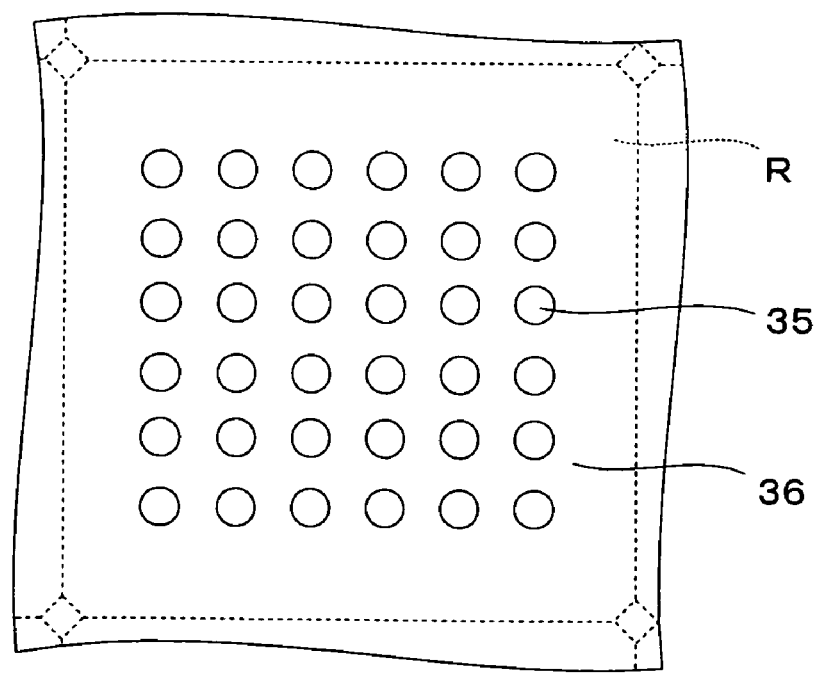
Figure 14:
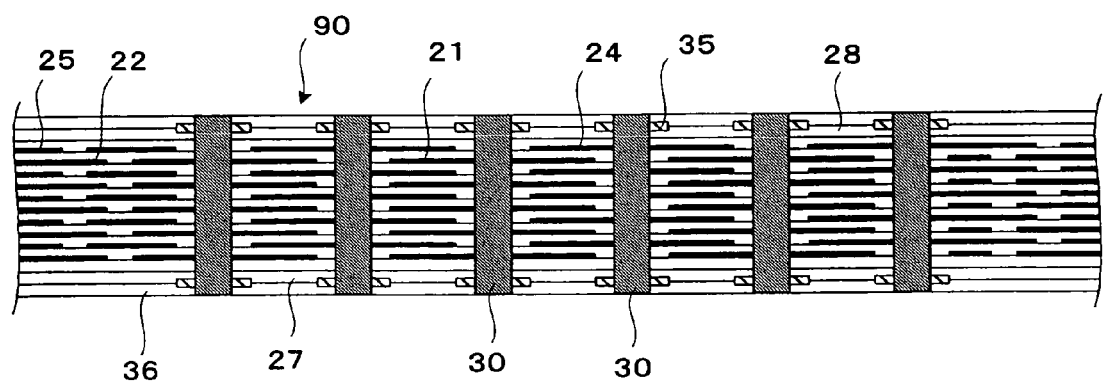
FIG. 14 is a cross-sectional view schematically illustrating the process of manufacturing a capacitor for incorporation in a wiring board in accordance with the fourth embodiment.

Hereafter, a description will be given of the process of fabricating the capacitor. FIGS. 13A and 13B are a side elevational view and a plan view of a ceramic green sheet with a ceramic pattern formed thereon in accordance with this embodiment. FIG. 14 is a cross-sectional view schematically illustrating the process of manufacturing a capacitor for incorporation in a wiring board in accordance with this embodiment.

First, a plurality of ceramic green sheets 36 (dielectric sheets) are prepared which constitute the cover layers 27 and 28 and on which ceramic patterns 35 (dielectric patterns) have been respectively formed (FIGS. 13A and 13B). It should be noted that although the ceramic pattern 35 is formed on the surface of the ceramic green sheet 36 constituting each of the cover layers 27 and 28, the ceramic pattern 35 may be formed on the surfaces of the ceramic green sheets 23 and 26 on which the inner electrode patterns 21 and 24 are formed and in the clearance holes 21a and 24.

The ceramic pattern 35 is formed at positions corresponding to the clearance holes 21a and 24a. The material constituting the ceramic pattern 35 should desirably be the same material as the ceramic material constituting the ceramic green sheet 36.

After preparing the ceramic green sheets 36 and the like, the ceramic green sheets 36 each having the ceramic pattern 35 formed thereon and a predetermined number of ceramic green sheets on which the inner electrode patterns 21 and the like have not been formed are laminated to fabricate the cover layer 27. Further, the ceramic green sheets 23 each having the inner electrode pattern 21 and the dummy electrode pattern 22 formed thereon and the ceramic green sheets 26 each having the inner electrode pattern 24 and the dummy electrode pattern 25 formed thereon are alternately laminated on the cover layer 27, and the cover layer 28 formed in a procedure similar to the above-described procedure is further laminated thereon. Subsequently, these laminated members are subjected to pressurization to form a laminated body 90. After the formation of the laminated body 90, via holes penetrating from the obverse surface to the reverse surface of the laminated body 90 are formed, and conductive paste is press fitted into the via holes, thereby forming the via conductor paste 30 serving as the via conductors 10 and 11 after firing (FIG. 14). Since the subsequent process is similar to that of the first embodiment, a description thereof will be omitted.

Normally, the thickness of the capacitor body at the portions where the clearance holes are present becomes thinner than the thickness of the other portions of the capacitor body since the one inner electrode layers are not present there. In contrast, in this embodiment, since the ceramic pattern 35 is formed on the cover layers 27 and 28 at the positions corresponding to the clearance holes 21a and 24a, the thickness of the capacitor body 2 at the portions where the clearance holes 21a and 24a are present can be made large, and can be made substantially the same as the thickness of the other portions of the capacitor body 2. It should be noted that even in the case where the ceramic pattern 35 is formed on the surfaces of the ceramic green sheets 23 and 26 where the inner electrode patterns 21 and 24 are formed and in the clearance holes 21a and 24a, it is possible to obtain advantages similar to those described above.

If a ceramic pattern having a larger thickness than the inner electrode patterns 21 and 24 is formed on the surfaces of the ceramic green sheets 23 and 26 where the inner electrode patterns 21 and 24 are formed and in the clearance holes 21a and 24a, there is a possibility that the ceramic pattern becomes deformed at the time of laminating the ceramic green sheets 23 and the like, possibly causing the positional offset of the inner electrode patterns 21 and 24. In contrast, in this embodiment, since the ceramic pattern 35 is formed on the surface of the ceramic green sheet 36 different from the ceramic green sheets 23 and 26 on which the inner electrode patterns 21 and 24 are formed and at positions corresponding to the clearance holes 21a and 24a, even in the case where the ceramic pattern 35 having a larger thickness than the inner electrode patterns 21 and 24 is formed, and the ceramic pattern 35 is slightly deformed, it is difficult for the positional offset of the inner electrode patterns 21 and 24 to occur at the time of the lamination of the ceramic green sheets 23 and the like, since the inner electrode patterns 21 and 24 are not formed on the ceramic green sheets 36.

Fifth Embodiment

Figure 15:
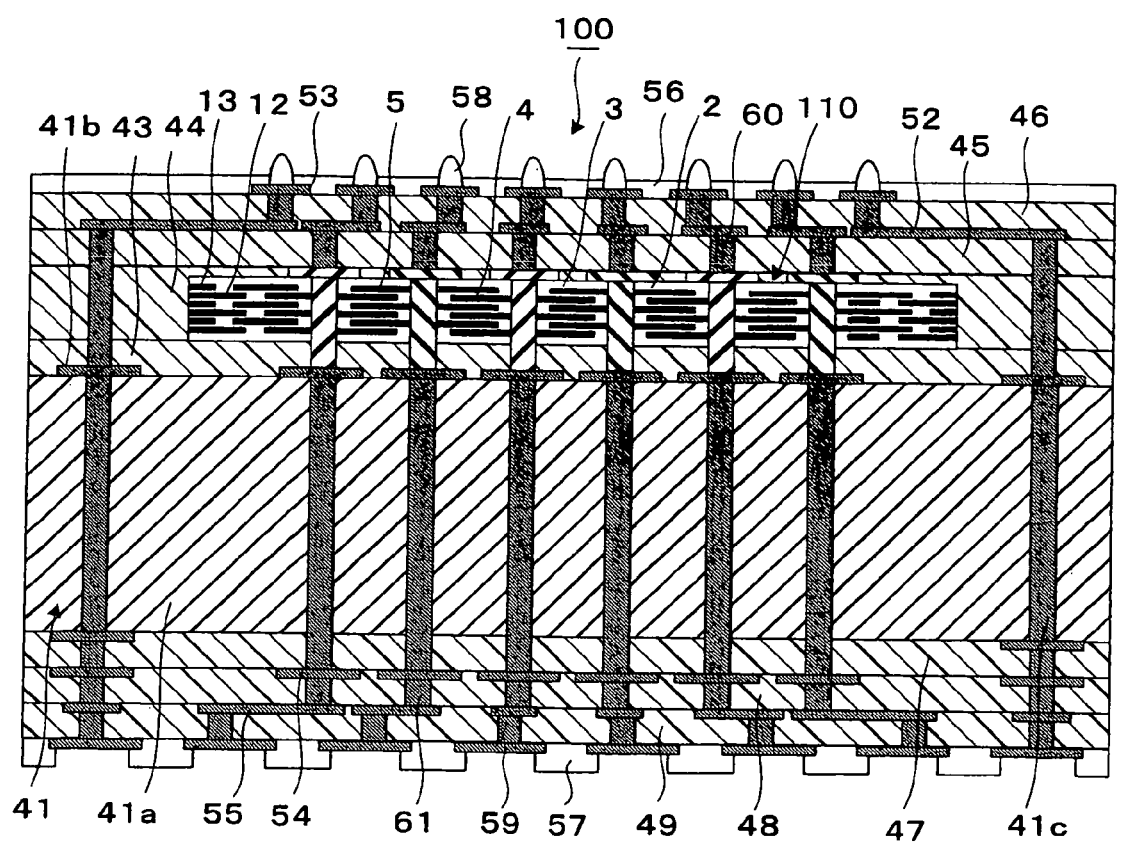
FIG. 15 is a schematic vertical cross-sectional view of the wiring board in which the capacitor for incorporation in a wiring board in accordance with a fifth embodiment is incorporated.

Referring now to the drawings, a description will be given of a fifth embodiment of the invention. In this embodiment, a description will be given of an example in which the capacitor is disposed in an insulating layer on the core board. FIG. 15 is a schematic vertical cross-sectional view of the wiring board in which the capacitor for incorporation in a wiring board in accordance with this embodiment is incorporated.

As shown in FIG. 15, an opening is not formed in the core board 41 of a wiring board 100, and a capacitor 110 is disposed in the insulating layer 44 on the core board 41. In the capacitor 110 of this embodiment, the total number of the inner electrode layers 4 and 5 is 10 or thereabouts, and its thickness is thinner than the thicknesses of the capacitors 1, 70, and 80 described in the first to third embodiments. It should be noted that although in this embodiment the capacitor 110 has a structure similar to that of the capacitor 1 described in the first embodiment, the capacitor 110 may has a structure similar to those of the capacitors 70 and 80 described in the second and third embodiments.

The capacitor 110 can be disposed in the insulating layer 44 in the following procedure, for example. First, the capacitor body 2 with the dummy electrode layers 12 and 13 formed thereon is disposed on the insulating layer 43 formed on the core board 41. Subsequently, the insulating layer 44 is placed on the capacitor body 2, and an assembly thereof is subjected to pressurization while being heated. As a result, the insulating layer 44 on the capacitor body 2 flows to the sides of the capacitor body 2, thereby allowing the capacitor body 2 to be disposed in the insulating layer 44. Subsequently, the via holes penetrating the insulating layers 43 and 44 and the capacitor body 2 are formed on and immediately above the wiring layers 41b, the via conductors 10 and 11 connected to the wiring layers 41b are formed in these via holes, and the outer terminals 6 and 7 are formed on the obverse surface of the capacitor body 2, thereby completing the capacitor 110.

In a case where the thickness of the capacitor is extremely thin, the mechanical strength of the capacitor declines, and warpage can possibly occur in the capacitor. In contrast, in this embodiment, since the dummy electrode layers 12 and 13 are provided, it is possible to improve the mechanical strength of the capacitor 110 and reduce the warpage occurring in the capacitor 110. It should be noted that in a case where the capacitors 70 and 80 described in the second and third embodiments are used as the capacitor 110 of this embodiment, similar advantages can be obtained.

In this embodiment, since the capacitor 110 is disposed in the insulating layer 44 formed on the core board 41, the distance between the capacitor 110 and the semiconductor chip can be made even shorter. As a result, it is possible to further decrease the wiring resistance and inductance.

It should be noted that, in the second embodiment, in the case where the dummy electrode layers 12 are disposed on the outer peripheral sides of the inner electrode layers 4, at least portions of the outer peripheral surfaces of the inner electrode layers 5 may be exposed from the ceramic layers 3. In addition, in the case where the dummy electrode layers 13 are disposed on the outer peripheral sides of the inner electrode layers 5, at least portions of the outer peripheral surfaces of the inner electrode layers 4 may be exposed from the ceramic layers 3. This arrangement makes it possible to alleviate the steps occurring due to the fact that electrode layers corresponding to the dummy electrode layers are not disposed in portions between the dielectric layers in the vicinities of the outer peripheries.

Sixth Embodiment

Figure 16:
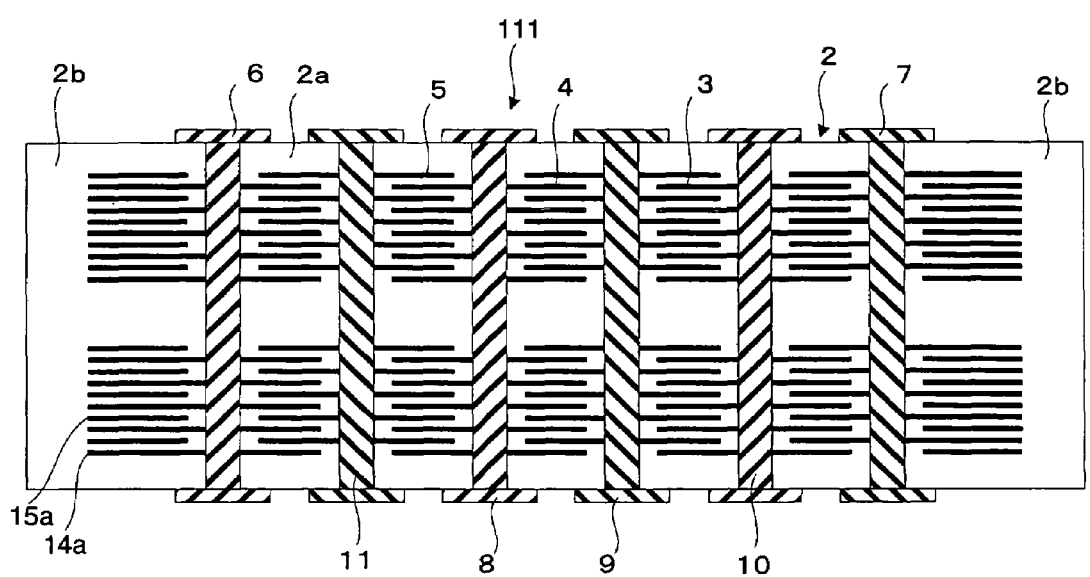
FIG. 16 is a schematic vertical cross-sectional view of a capacitor for incorporation in a wiring board in accordance with a sixth embodiment.
Figure 17A:
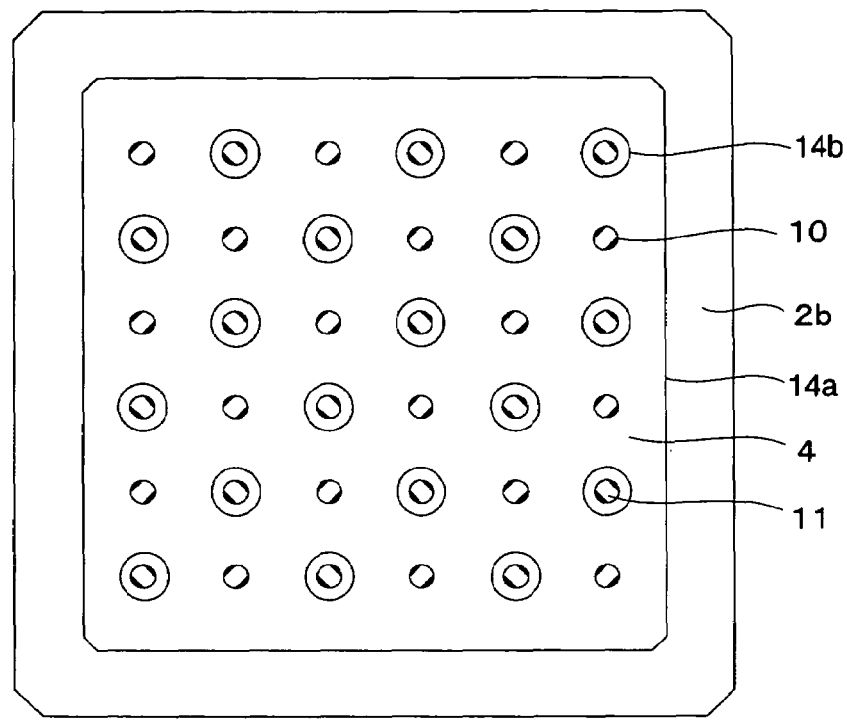
FIGS. 17A and 17B are schematic horizontal cross-sectional views of the capacitor for incorporation in a wiring board in accordance with the sixth embodiment.
Figure 17B:
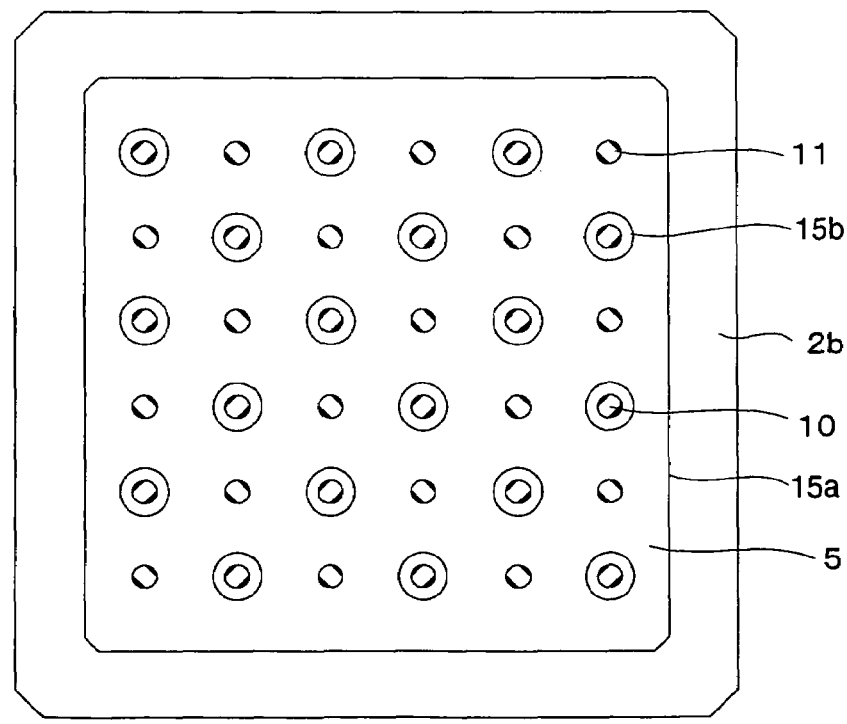
Figure 18:
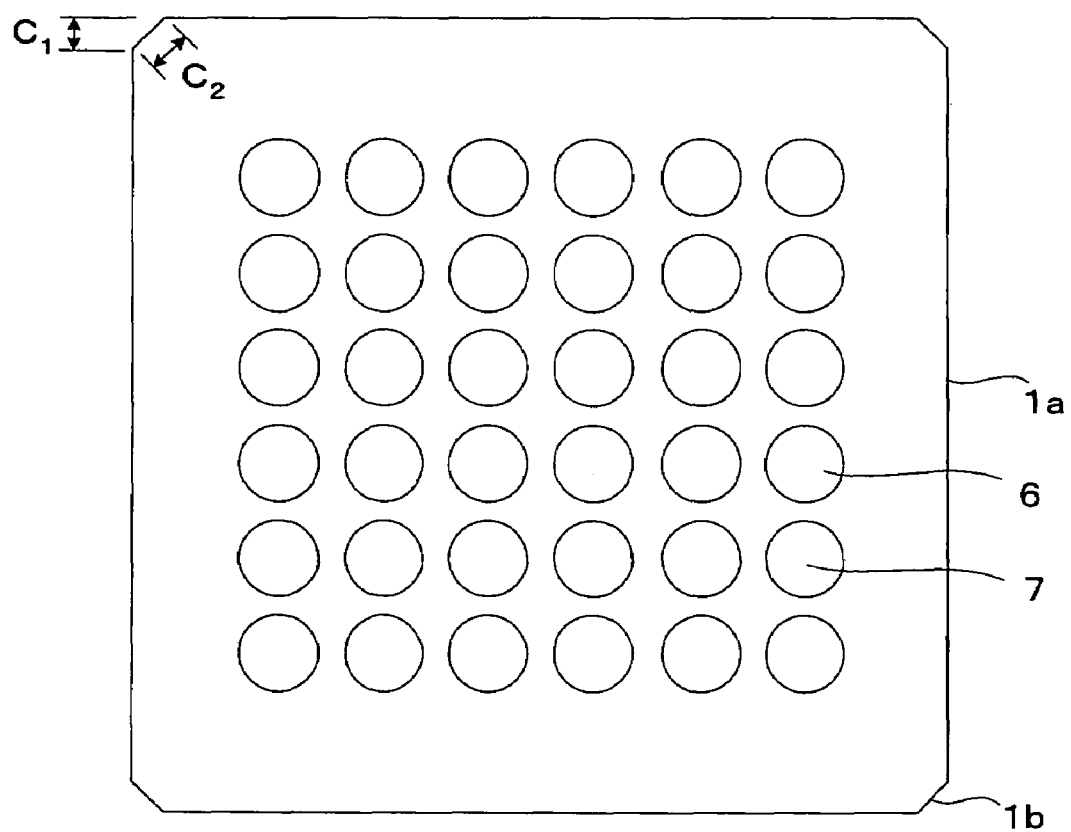
FIG. 18 is a schematic plan view of the capacitor for incorporation in a wiring board in accordance with the sixth embodiment.

Referring now to the drawings, a description will be given of a sixth embodiment of the invention. FIG. 16 is a schematic vertical cross-sectional view of a capacitor for incorporation in a wiring board in accordance with this embodiment. FIGS. 17A and 17B are schematic horizontal cross-sectional views of the capacitor for incorporation in a wiring board in accordance with this embodiment. FIG. 18 is a schematic plan view of the capacitor for incorporation in a wiring board in accordance with this embodiment.

A capacitor 111 shown in FIGS. 16 to 18 is a laminated capacitor formed in the shape of a rectangular parallelepiped. The capacitor 111 has the capacitor body 2 constituting the core of the capacitor 111 and comprised of a capacitor body portion 2a and a capacitor end portion 2b.

The capacitor body portion 2a is comprised of the plurality of ceramic layers 3 (dielectric layers) laminated in the vertical direction, as well as the pluralities of the inner electrode layers 4 and 5 each disposed between adjacent ones of the ceramic layers 3.

The capacitor end portion 2b covers outer peripheral surfaces 14a and 15a of the inner electrode layers 4 and 5, and is integrated with the ceramic layers 3. The capacitor end portion 2b is constituted of a ceramic material (dielectric material), and is formed of the same material as the ceramic material constituting the ceramic layers 3 since the capacitor end portion 2b is integrated with the ceramic layers 3.

The thickness of the capacitor end portion 2b is thicker than the total thickness of the ceramic layers 3 at the portion where the inner electrode layers 4 and 5 are present.

Figure 19A:
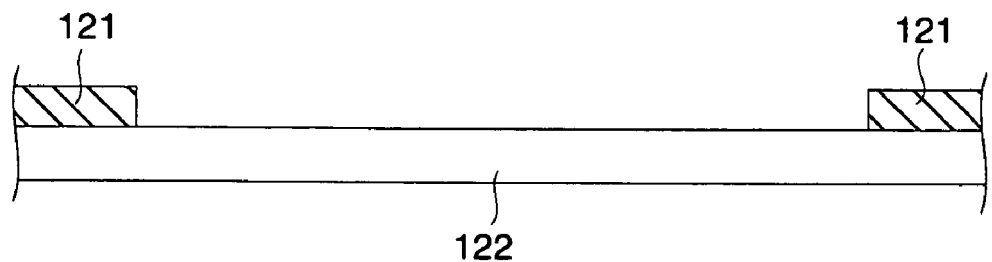
FIGS. 19A and 19B are a side elevational view and a plan view of a ceramic green sheet with a ceramic pattern formed thereon in accordance with the sixth embodiment.
Figure 19B:
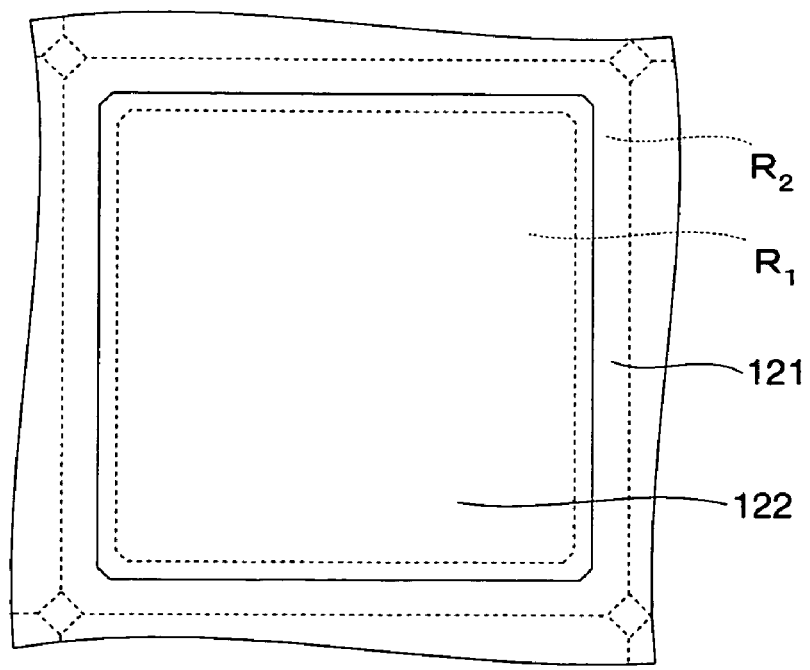
Figure 20A:
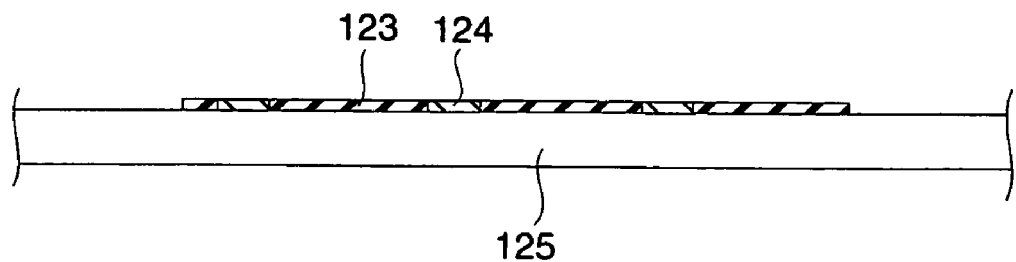
FIGS. 20A and 20B are a side elevational view and a plan view of the ceramic green sheet with an inner electrode pattern and a ceramic pattern formed thereon in accordance with the sixth embodiment.
Figure 20B:
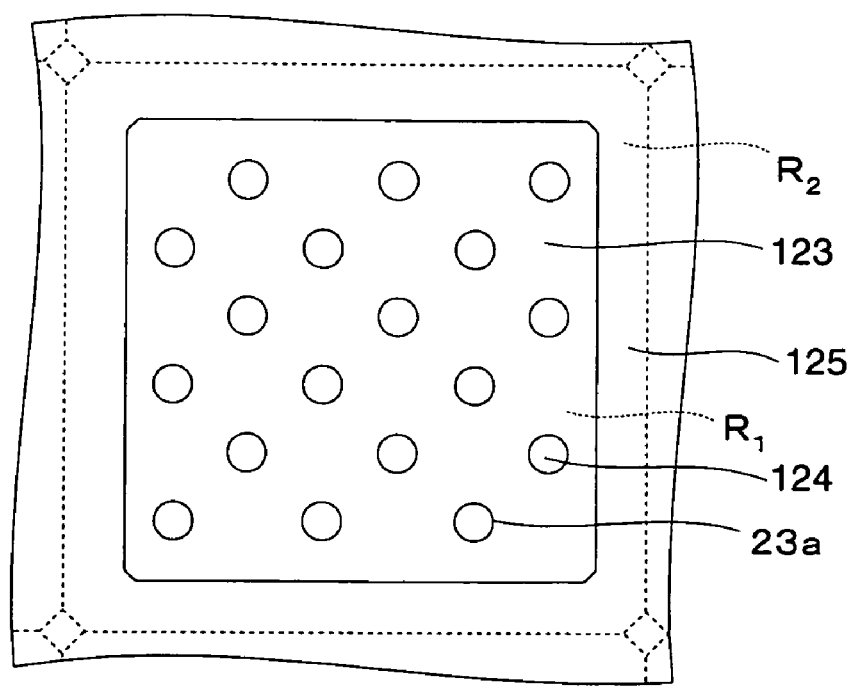
Figure 21A:
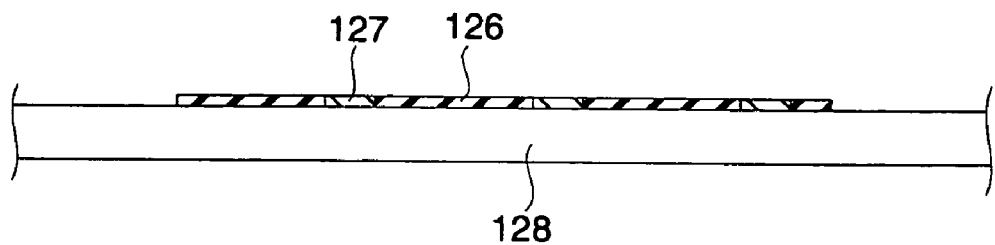
FIGS. 21A and 21B are a side elevational view and a plan view of the ceramic green sheet with an inner electrode pattern and a ceramic pattern formed thereon in accordance with the sixth embodiment.
Figure 21B:
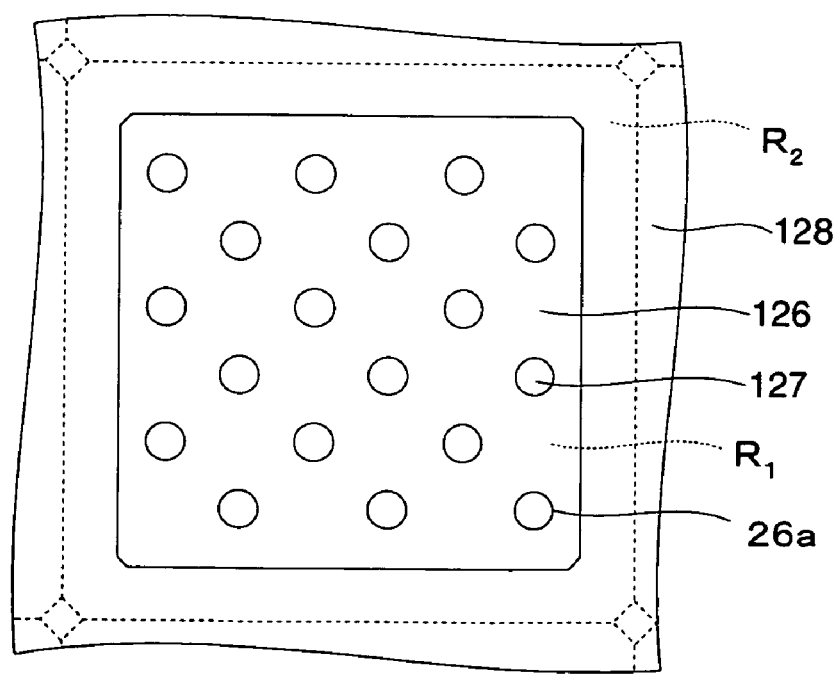
Figure 22A:
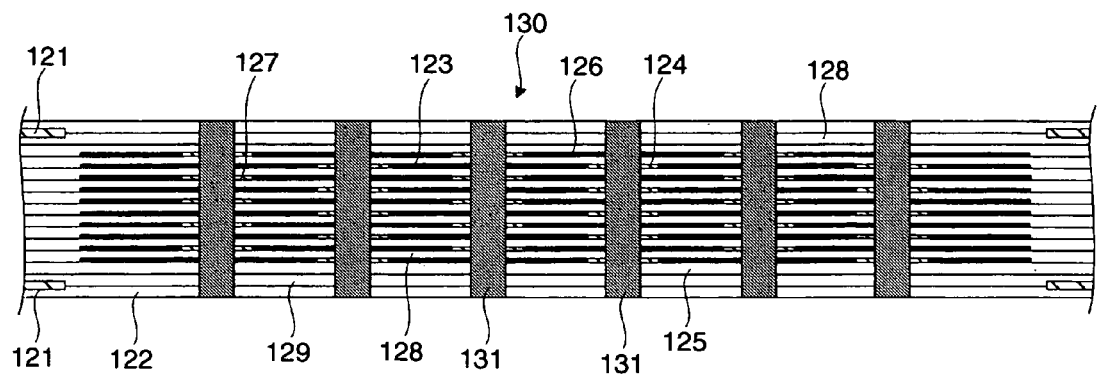
FIGS. 22A and 22B are cross-sectional views schematically illustrating the process of manufacturing a capacitor for incorporation in a wiring board in accordance with the sixth embodiment.
Figure 22B:
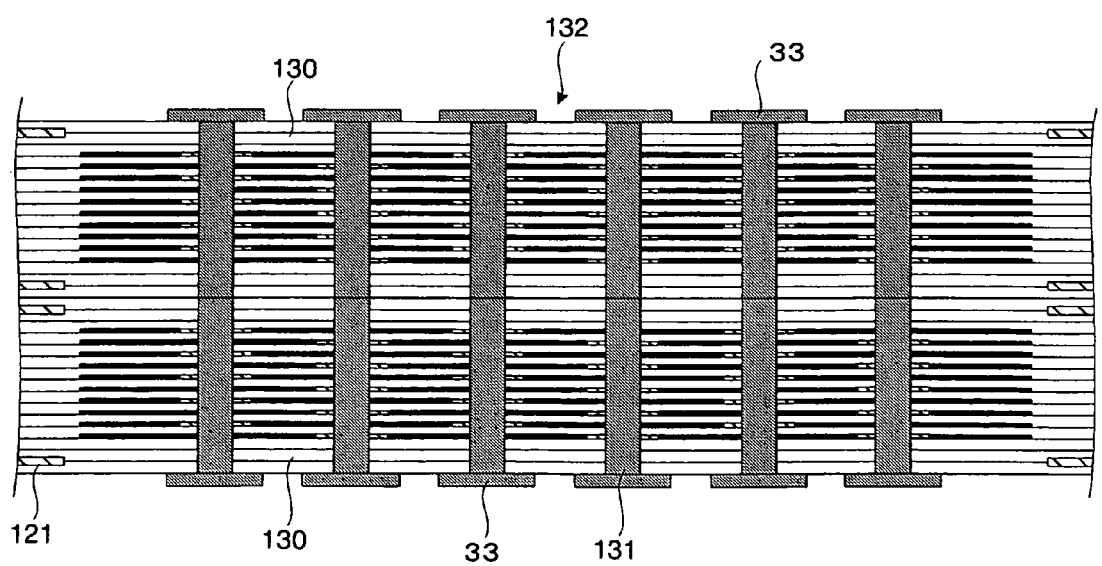
Figure 23A:
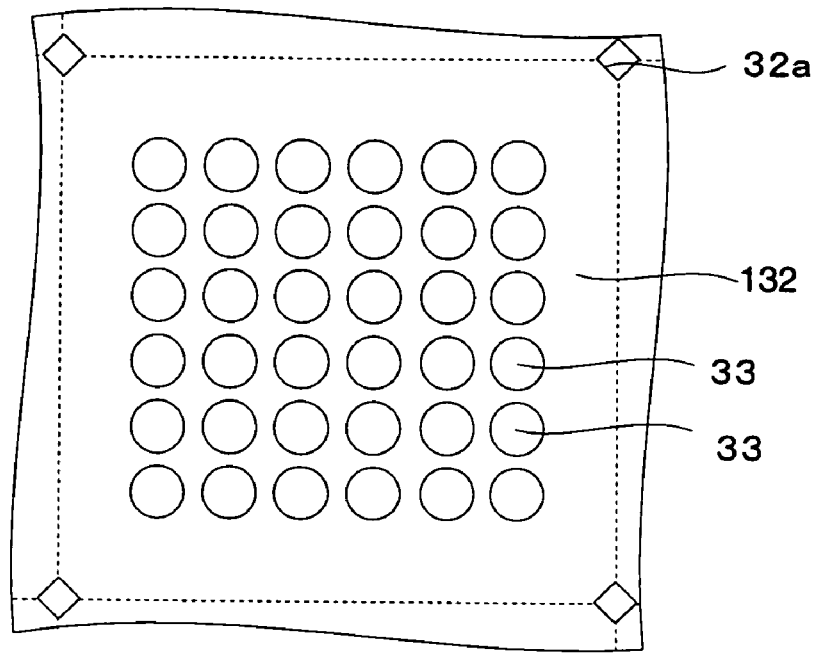
FIGS. 23A and 23B are plan views schematically illustrating the process of manufacturing a capacitor for incorporation in a wiring board in accordance with the sixth embodiment.
Figure 23B:
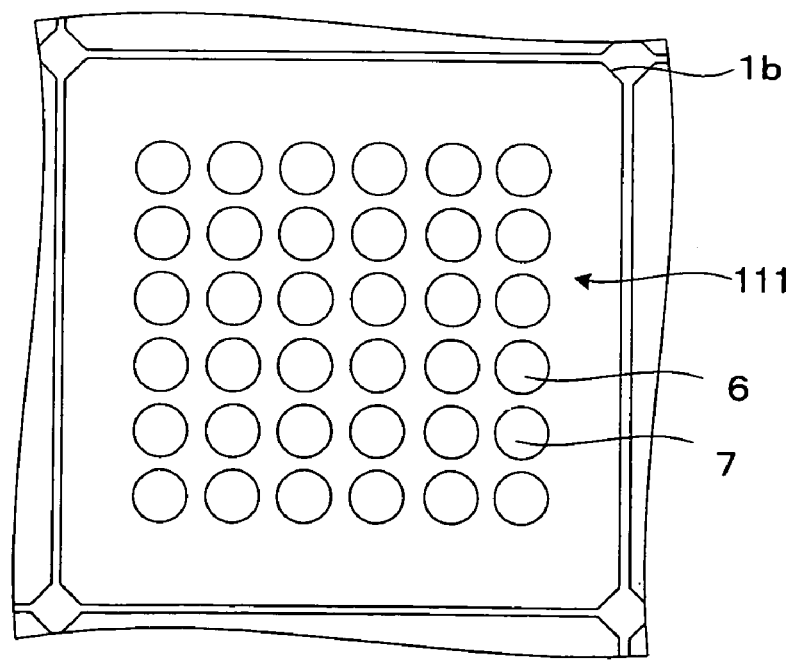

The capacitor 111 can be fabricated by the following procedure, for example. It should be noted that in this embodiment a description will be given of a process in which a plurality of capacitors 111 are fabricated at one time. FIGS. 19A and 19B are a side elevational view and a plan view of a ceramic green sheet with a ceramic pattern formed thereon in accordance with this embodiment. FIGS. 20A and 21A are side elevational views of the ceramic green sheet with an inner electrode pattern and a ceramic pattern formed thereon in accordance with this embodiment. FIGS. 20B and 21B are plan views of the ceramic green sheet with an inner electrode pattern and a ceramic pattern formed thereon in accordance with this embodiment. FIGS. 22A and 22B are cross-sectional views schematically illustrating the process of manufacturing a capacitor for incorporation in a wiring board in accordance with this embodiment. FIGS. 23A and 23B are plan views schematically illustrating the process of manufacturing a capacitor for incorporation in a wiring board in accordance with this embodiment.

First, a plurality of ceramic green sheets 122 (dielectric sheets) each having a ceramic pattern 121 (first dielectric pattern) formed thereon are prepared (FIGS. 19A and 19B). The ceramic pattern 121 constitutes a portion of the capacitor end portion 2b after firing. The ceramic pattern 121 is provided in such a manner as to surround a region $R_1$ (hereafter, this region will be referred to as the "capacitor body portion region") serving as the capacitor body portion 2a by such as screen printing, and is formed in a region $R_2$ (hereafter, this region will be referred to as the "capacitor end portion region") serving as the capacitor end portion 2b. In addition, the ceramic pattern 121 may be formed by laminating on the capacitor end portion region $R_2$ a dielectric sheet processed into the shape of the capacitor end portion region $R_2$.

The material constituting the ceramic pattern 121 should desirably be the same material as the ceramic material constituting the ceramic green sheet 122 if consideration is given to the effect at the time of the firing of the ceramic green sheet 122 and the like.

The average particle size of the ceramic (dielectric) material constituting the ceramic pattern should preferably be larger than the average particle size of the ceramic (dielectric) material constituting the ceramic green sheet 122. As a result, since the thicknesswise shrinkage of the ceramic pattern 121 becomes less than the thicknesswise shrinkage of the ceramic green sheet 122, the required thickness can be obtained by a less number of layers.

It should be noted that, in this embodiment, since a plurality of capacitors 111 are fabricated at one time, pluralities of capacitor body portion regions $R_1$ and capacitor end portion regions $R_2$ are present in the ceramic green sheet 122, and the ceramic patterns 121 are formed integrally with their adjacent ceramic patterns 121.

Furthermore, pluralities of ceramic green sheets 125 (dielectric sheets) each having an inner electrode pattern 123 and a ceramic pattern 124 (second dielectric pattern) formed thereon and ceramic green sheets 128 (dielectric sheets) each having an inner electrode pattern 126 and a ceramic pattern 127 (second dielectric pattern) formed thereon are prepared (FIGS. 20A to 21B).

The inner electrode patterns 123 and 126 are those which serve as the inner electrode layers 4 and 5 after firing, and are formed in the capacitor body portion region $R_1$ by such as screen printing. Further, clearance holes 23a and 26a (hole portions) which serve as the clearance holes 14b and 15b after firing are respectively formed in the inner electrode patterns 123 and 126.

The ceramic patterns 124 and 127 are those which serve as portions of the ceramic layers 3 after firing, and are formed in the clearance holes 23a and 26a by such as screen printing. The ceramic patterns 124 and 127 should desirably be constituted of the same material as the ceramic material constituting the ceramic green sheets 125 and 128 if consideration is given to the effect at the time of the firing of the ceramic green sheets 125 and 128 and the like. Additionally, the thickness of each of the ceramic patterns 124 and 127 should desirably be substantially the same as the thickness of each of the inner electrode patterns 123 and 126.

It should be noted that instead of or in addition to forming the ceramic pattern 121 on the ceramic green sheet 122, the ceramic pattern 121 may be formed on the ceramic green sheets 125 and 128. In this case, the ceramic pattern 121 should desirably have the same thickness as the thickness of each of the inner electrode patterns 123 and 126 if consideration is given to the effect at the time of the firing of the ceramic green sheets 125 and 128 and the like.

After preparing these ceramic green sheets 122 and the like, the ceramic green sheets 122 each having the ceramic pattern 121 formed thereon and a predetermined number of ceramic green sheets 129 on which the inner electrode patterns 123 and the like have not been formed are laminated to fabricate the cover layer. Then, the ceramic green sheets 125 each having the inner electrode patterns 123 and the like formed thereon and the ceramic green sheets 128 each having the inner electrode patterns 126 and the like formed thereon are alternately laminated on that cover layer. A cover layer formed in a similar procedure is further laminated thereon. Subsequently, these laminated members are subjected to pressurization to form a laminated body 130. After the formation of the laminated body 130, via holes penetrating from the obverse surface to the reverse surface of the laminated body 130 are formed, and conductive paste is press fitted into the via holes, thereby forming via conductor paste 131 serving as the via conductors 10 and 11 after firing (FIG. 22A).

Next, another laminated body 130 formed in a similar procedure is superposed on the laminated body 130 with the via conductor paste 131 formed thereon, and this superposed assembly is subjected to pressurization to form a laminated body 132. Subsequently, outer terminal patterns 33 connected to the via conductor paste 131 and serving as the outer electrode terminals 6 to 9 after firing are formed on the obverse surface and the reverse surface of the laminated body 132 by such as screen printing (FIG. 22B).

After the formation of the outer terminal patterns 33, portions which serve as the corners of the capacitors 111 are punched into rectangular shapes by such as punching to thereby form portions 32a serving as the chamfered portions 1b (FIG. 23A). Further, break grooves are formed along the broken lines shown in FIG. 23A by a laser or the like.

Subsequently, these are degreased and are fired at a predetermined temperature for a predetermined time. As a result of this firing, the ceramic patterns 121, the ceramic green sheets 122, and the like are sintered, and the ceramic layers 3 and the capacitor end portion 2b are thereby formed. Also, the inner electrode patterns 121 and the like are sintered, and the inner electrode layers 4 and the like are thereby formed.

After firing, the second plating films are respectively formed on the surfaces of the outer electrodes 6 and 9 by such as electroless plating, and the first plating films are further formed on the surfaces of the second plating films by such as electroless plating. It should be noted that the aforementioned second plating films may not be formed in the case where plating treatment can be directly provided to the outer electrodes 6 and 9 with the ceramic material added thereto, and the adhesive strength is high.

Then, the adjacent capacitors 111 are finally cut off along the broken lines shown in FIG. 23A (FIG. 23B). As a result, a plurality of capacitors 111 shown in FIG. 16 are fabricated.

Figure 24:
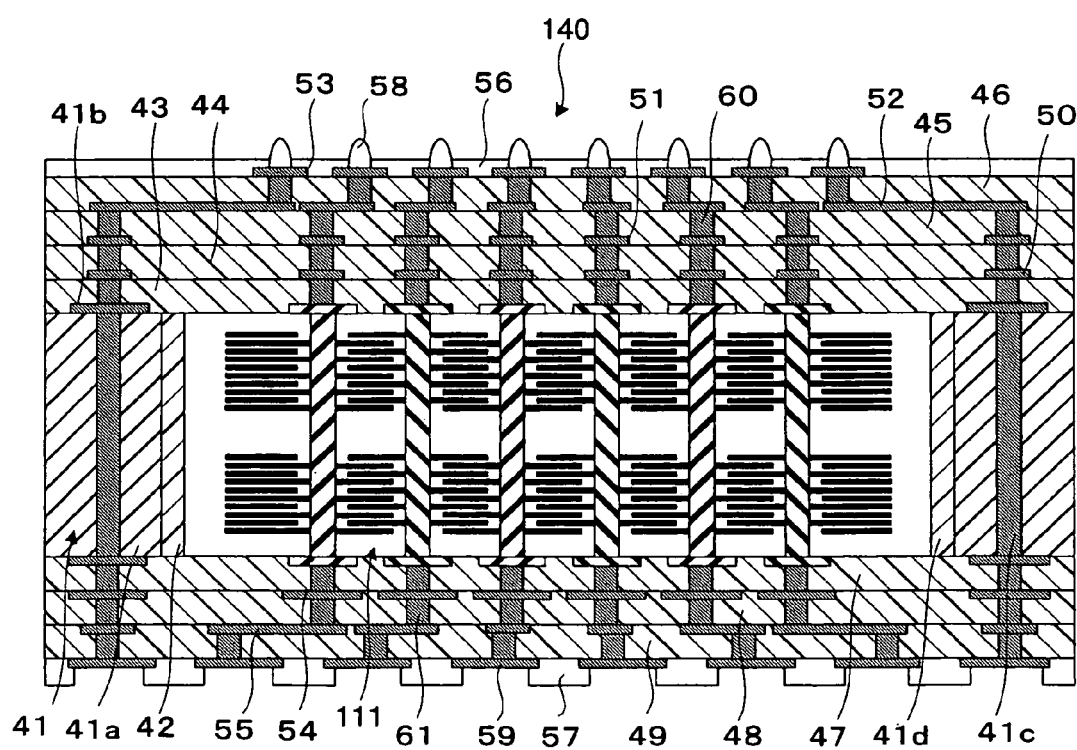
FIG. 24 is a schematic vertical cross-sectional view of a wiring board in which the capacitor for incorporation in a wiring board in accordance with the sixth embodiment is incorporated.

The capacitor 111 is used by being incorporated in a wiring board. Hereafter, a description will be given of a wiring board incorporating the capacitor 111. FIG. 24 is a schematic vertical cross-sectional view of a wiring board in which the capacitor for incorporation in a wiring board in accordance with this embodiment is incorporated.

A wiring board 140 shown in FIG. 24 is an organic board which is formed in the shape of a rectangular parallelepiped.

In this embodiment, since the ceramic pattern 121 is formed on the surface of the ceramic green sheet 122 in the capacitor end portion region $R_2$, it is possible to enlarge the thickness of the capacitor end portion 2b, thereby making it possible to provide the capacitor 111 in which the steps formed in the vicinities of the capacitor end portion 2b are alleviated. Hence, when the resin filler 42 is filled into the gaps between the core board 41 and the capacitor 111, the resin filler 42 becomes difficult to flow onto the reverse surface side of the capacitor 111. As a result, since the resin filler 42 becomes difficult to come into contact with the outer terminals 8 and 9 disposed on the reverse surface of the capacitor 111, it is possible to reduce faulty conduction.

In this embodiment, since the ceramic pattern 121 is formed on the ceramic green sheet 122 used at the time of fabrication of the cover layer, the ceramic pattern 121 can be formed with relatively less dependence on the thickness of the inner electrode patterns 123 and 126. As a result, the ceramic pattern 121 can be formed to be thicker than the case in which the ceramic pattern 121 is formed on the ceramic green sheets 125 and 128 on which the inner electrode patterns 123 and 126 are respectively formed, thereby making it possible to reduce the steps for forming the ceramic pattern 121.

Normally, the thickness of the capacitor body portion at the portions where the clearance holes are present becomes thinner than the thickness of the other portions of the capacitor body portion since the one inner electrode layers are not present there. In contrast, in this embodiment, since the ceramic patterns 124 and 127 are formed in the clearance holes 23a and 26a, the thickness of the capacitor body portion 2a at the portions where the clearance holes 14b and 15b are present can be made large, and can be made substantially the same as the thickness of the other portions of the capacitor body portion 2a.

In this embodiment, since the chamfered portion 1b with a chamfer dimension $C_1$ of 0.6 mm or more is formed at each corner of the outer peripheral surfaces 1a of the capacitor 111, it is difficult for the thermal stress to be concentrated at the corner portions of the resin filler 42 on the capacitor 111 side, so that it is possible to suppress the occurrence of cracks at the corner portions of the resin filler 42 on the capacitor 111 side. It should be noted that even in a case where a rounded portion 1c with a radius of curvature of 0.6 mm or more is formed at each corner of the outer peripheral surfaces 1a of the capacitor 111, it is possible to obtain an advantage similar to that of the chamfered portion 1b.

In this embodiment, since the chamfered portion 1b or the rounded portion is formed at each corner of the outer peripheral surfaces 1a of the capacitor 111, the distance from the ceramic layer 3 to a signal line which is present in the vicinity of the corner of the capacitor 111 becomes large as compared with a case where the chamfered portion 1b or the rounded portion is not formed. As a result, it is possible to reduce a signal delay of a signal line which is present in the vicinity of the corner of the capacitor 111.

Seventh Embodiment

Referring now to the drawings, a description will be given of a seventh embodiment of the invention. In this embodiment, a description will be given of an example in which a ceramic pattern is formed on the surface of a ceramic green sheet different from the ceramic green sheet on which the inner electrode pattern is formed and at positions corresponding to the clearance holes.

Figure 25A:
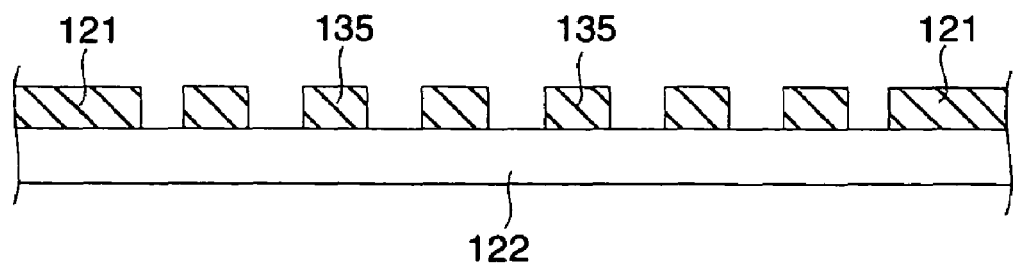
FIGS. 25A and 25B are a side elevational view and a plan view of a ceramic green sheet with ceramic patterns formed thereon in accordance with a seventh embodiment.
Figure 25B:
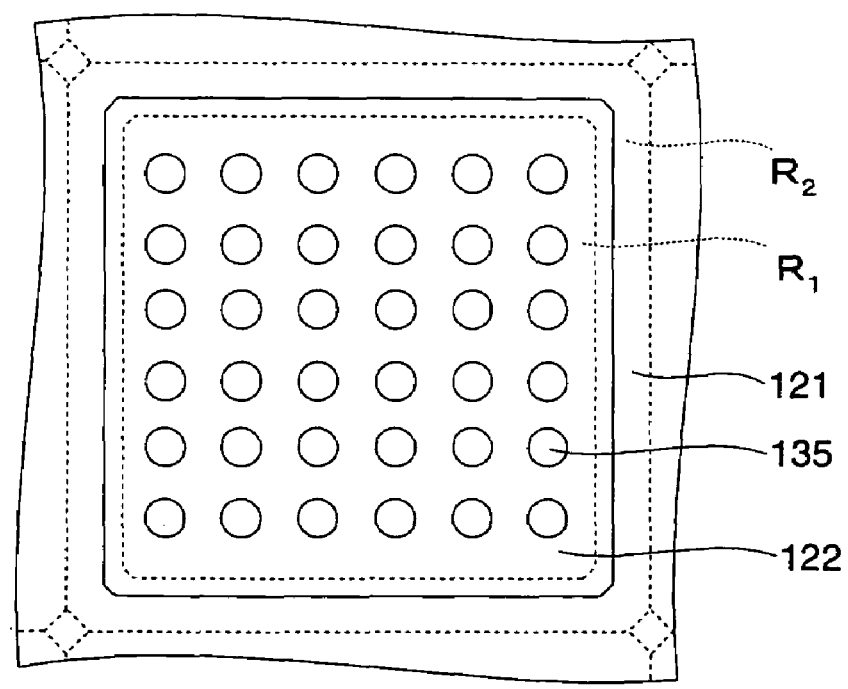
Figure 26A:
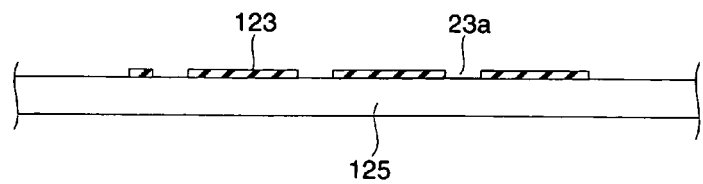
FIGS. 26A and 26B are side elevational views of the ceramic green sheet with an inner electrode pattern formed thereon in accordance with the seventh embodiment.
Figure 26B:
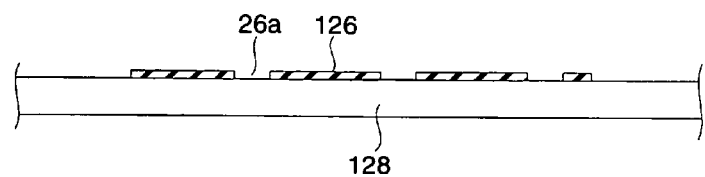
Figure 27:
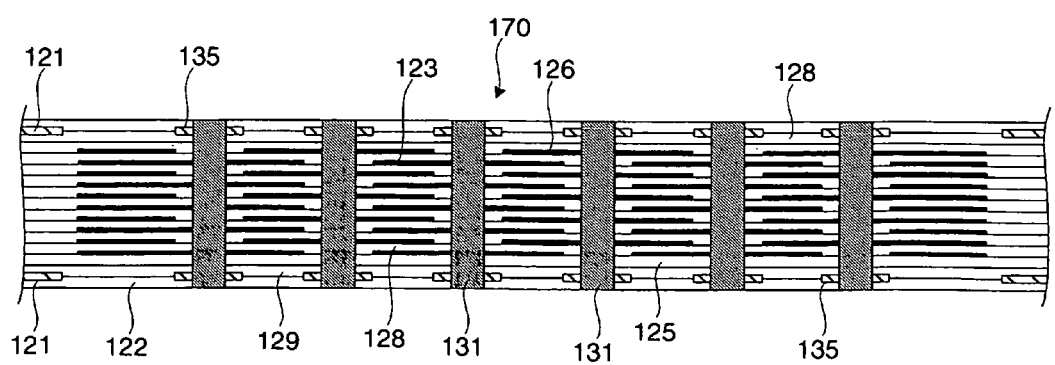
FIG. 27 is a cross-sectional view schematically illustrating the process of manufacturing a capacitor for incorporation in a wiring board in accordance with the seventh embodiment.

Hereafter, a description will be given of the process of fabricating the capacitor. FIGS. 25A and 25B are a side elevational view and a plan view of a ceramic green sheet with ceramic patterns formed thereon in accordance with this embodiment. FIGS. 26A and 26B are side elevational views of the ceramic green sheet with an inner electrode pattern formed thereon in accordance with this embodiment. FIG. 27 is a cross-sectional view schematically illustrating the process of manufacturing a capacitor for incorporation in a wiring board in accordance with this embodiment.

First, the plurality of ceramic green sheets 122 (dielectric sheets) are prepared on which the ceramic patterns 121 and ceramic patterns 135 (second dielectric patterns) have been respectively formed (FIGS. 25A and 25B). It should be noted that although the ceramic pattern 135 is formed on the surface of the ceramic green sheet 122 on which the ceramic pattern 121 is formed, the ceramic pattern 135 may be formed on the surfaces of other ceramic green sheets other than the surfaces of the ceramic green sheets 125 and 128 on which the inner electrode patterns 123 and 126 are respectively formed.

The ceramic pattern 135 is formed at positions corresponding to the clearance holes 23a and 26a. The material constituting the ceramic pattern 135 should desirably be the same material as the ceramic material constituting the ceramic green sheet 122.

Furthermore, the plurality of ceramic green sheets 125 each having the inner electrode patterns 123 formed thereon and the plurality of ceramic green sheets 128 each having the inner electrode pattern 126 formed thereon are prepared (FIGS. 26A and 26B). It should be noted that in this embodiment the ceramic patterns 124 and 127 are not formed on the ceramic green sheets 125 and 128.

After preparing these ceramic green sheets 122 and the like, the ceramic green sheets 122 each having the ceramic patterns 121 and 135 formed thereon and the predetermined number of ceramic green sheets 129 on which the inner electrode patterns 123 and the like have not been formed are laminated to fabricate the cover layer. Further, the ceramic green sheets 125 each having the inner electrode pattern 123 formed thereon and the ceramic green sheets 128 each having the inner electrode pattern 126 formed thereon are alternately laminated on the cover layer, and a cover layer formed in a similar procedure is further laminated thereon. Subsequently, these laminated members are subjected to pressurization to form a laminated body 170. After the formation of the laminated body 170, via holes penetrating from the obverse surface to the reverse surface of the laminated body 170 are formed, and conductive paste is press fitted into the via holes, thereby forming the via conductor paste 131 serving as the via conductors 10 and 11 after firing (FIG. 27). Since the subsequent process is similar to that of the first and sixth embodiments, a description thereof will be omitted.

If a ceramic pattern having a larger thickness than the inner electrode patterns 123 and 126 is formed on the surfaces of the ceramic green sheets 125 and 128 where the inner electrode patterns 123 and 126 are formed and in the clearance holes 23a and 26a, there is a possibility that the ceramic pattern becomes deformed at the time of laminating the ceramic green sheets 125 and the like, possibly causing the positional offset of the inner electrode patterns 123 and 126. In contrast, in this embodiment, since the ceramic pattern 135 is formed on the surface of the ceramic green sheet 122 different from the ceramic green sheets 125 and 128 on which the inner electrode patterns 123 and 126 are formed and at positions corresponding to the clearance holes 23a and 26a, even in the case where the ceramic pattern 135 having a larger thickness than the inner electrode patterns 123 and 126 is formed, and the ceramic pattern 135 is slightly deformed, it is difficult for the positional offset of the inner electrode patterns 123 and 126 to occur at the time of the lamination of the ceramic green sheets 125 and the like, since the inner electrode patterns 123 and 126 are not formed on the ceramic green sheets 122.

Eighth Embodiment

Figure 28:
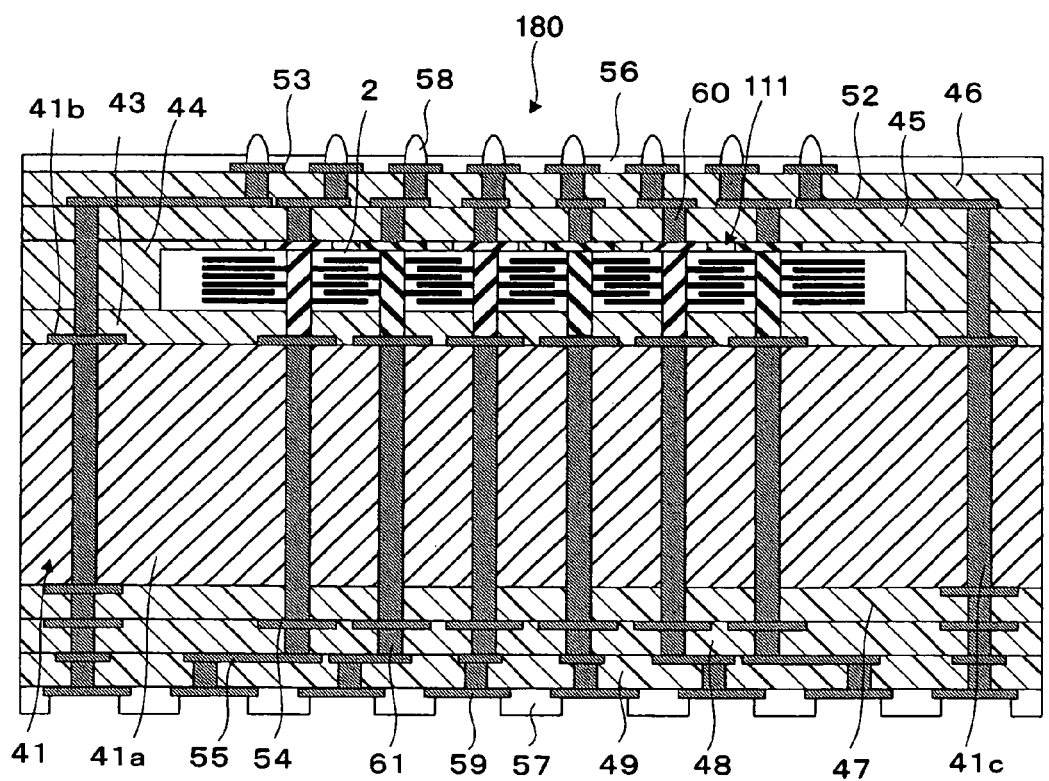
FIG. 28 is a schematic vertical cross-sectional view of the wiring board in which the capacitor for incorporation in a wiring board in accordance with an eighth embodiment is incorporated.

Referring now to the drawings, a description will be given of an eighth embodiment of the invention. In this embodiment, a description will be given of an example in which the capacitor is disposed in an insulating layer on the core board. FIG. 28 is a schematic vertical cross-sectional view of the wiring board in which the capacitor for incorporation in a wiring board in accordance with this embodiment is incorporated.

As shown in FIG. 28, an opening is not formed in the core board 41 of a wiring board 180, and the capacitor 111 is disposed in the insulating layer 44 on the core board 41. In the capacitor 111 of this embodiment, the total number of the inner electrode layers 4 and 5 is 10 or thereabouts, and its thickness is thinner than the thicknesses of the capacitor 111 described in the sixth embodiment.

In a case where the thickness of the capacitor is extremely thin, the mechanical strength of the capacitor declines, and warpage can possibly occur in the capacitor. In contrast, in this embodiment, since the ceramic pattern 121 is formed on the surface of the ceramic green sheet 122 in the capacitor end portion region $R_2$, it is possible to enlarge the thickness of the capacitor end portion 2b. As a result, it is possible to improve the mechanical strength of the capacitor 111 and reduce the warpage occurring in the capacitor 111.

In this embodiment, since the capacitor 111 is disposed in the insulating layer 44 formed on the core board 41, the distance between the capacitor 111 and the semiconductor chip can be made even shorter. As a result, it is possible to further decrease the wiring resistance and inductance.

The present invention is not limited to the contents described in the above-described embodiments, and the structure and materials, the arrangement of the respective members, and the like may be modified, as required, within the scope that does not depart from the gist of the invention.

This application is based on Japanese Patent application JP 2005-251953, filed Aug. 31, 2005, Japanese Patent application JP 2005-259502, filed Sep. 7, 2005, Japanese Patent application JP 2006-168457, filed Jun. 19, 2006, and Japanese Patent application JP 2006-168458, filed Jun. 19, 2006, the entire contents of which are hereby incorporated by reference, the same as if set forth at length.

What is claimed is:

1. A capacitor comprising:
   a plurality of laminated dielectric layers;
   a plurality of inner electrode layers each disposed between mutually adjacent ones of the dielectric layers; and
   dummy electrode layers respectively disposed between the dielectric layers, disposed on sides closer to outer peripheral sides of the dielectric layers than to the inner electrode layers and disposed apart from the inner electrode layers;
   wherein each of the dummy electrode layers is formed in substantially a same plane as that of each of the inner electrode layers by using a printing method, and
   of gaps between each of the inner electrode layers and a corresponding one of the dummy electrode layers, a width of the gap extending in a direction perpendicular to a printing direction of the dummy electrode layer and a width of the gap extending in a direction parallel to the printing direction of the dummy electrode layer are respectively 50 to 350 μm, and the width of the gap extending in the direction perpendicular to the printing direction of the dummy electrode layer is equal to or greater than the width of the gap extending in the direction parallel to the printing direction of the dummy electrode layer.

2. The capacitor according to claim 1, wherein outer peripheral surfaces of the dummy electrode layers are exposed from between the dielectric layers.

3. The capacitor according to claim 1, wherein the inner electrode layers include first inner electrode layers and second inner electrode layers arranged alternately with the first inner electrode layers via the dielectric layer, and
   the dummy electrode layer is disposed so as to be set in substantially a same plane as that of either one of the first inner electrode layer and the second inner electrode layer.

4. The capacitor according to claim 1, further comprising: a via conductor penetrating at least one of the dielectric layers in a thicknesswise direction of the dielectric layer and electrically connected to at least one of the inner electrode layers.

5. A wiring board incorporating the capacitor according to claim 1.

6. A capacitor comprising:
   a plurality of laminated dielectric layers;
   a plurality of inner electrode layers each disposed between mutually adjacent ones of the dielectric layers; and
   dummy electrode layers respectively disposed between the dielectric layers, disposed on sides closer to outer peripheral sides of the dielectric layers than to the inner electrode layers and disposed apart from the inner electrode layers,
   wherein the inner electrode layers include first inner electrode layers and second inner electrode layers arranged alternately with the first inner electrode layers via the dielectric layer,
   the dummy electrode layers include first dummy electrode layers each disposed substantially in a same plane as that of each of the first inner electrode layers and second dummy electrode layers each disposed substantially in a same plane as that of each of the second inner electrode layers, and a first gap between the first inner electrode layer and the first dummy electrode layer and a second gap between the second inner electrode layer and the second dummy electrode layer do not overlap in a laminated direction of the dielectric layers.

7. The capacitor according to claim 6, wherein the width of the first gap and the width of the second gap are respectively 50 μm or more.

8. The capacitor according to claim 6, wherein the first dummy electrode layer and the second dummy electrode layer, and the first dummy electrode layer and the second inner electrode layer, or the second dummy electrode layer and the first inner electrode layer, partially overlap in the laminated direction of the dielectric layers, and
  a width of an overlapping portion between the first dummy electrode layer and the second dummy electrode layer in the laminated direction of the dielectric layers is equal to or greater than a width of an overlapping portion between the first dummy electrode layer and the second inner electrode layer or between the second dummy electrode layer and the first inner electrode layer in the laminated direction of the dielectric layers.

9. The capacitor according to claim 6, wherein the first dummy electrode layer and the second dummy electrode layer partially overlap in the laminated direction of the dielectric layers, and
  the width of the overlapping portion between the first dummy electrode layer and the second dummy electrode layer in the laminated direction of the dielectric layers is equal to or greater than 100 μm.

10. A capacitor comprising:
a plurality of laminated dielectric layers;
a plurality of inner electrode layers each disposed between mutually adjacent ones of the dielectric layers; and
dummy electrode layers respectively disposed between the dielectric layers, disposed on sides closer to outer peripheral sides of the dielectric layers than to the inner electrode layers and disposed apart from the inner electrode layers,
wherein one of the dummy electrode layers continuously surrounds a perimeter of the whole of the inner electrode layers.

11. The capacitor according to claim 10, wherein outer peripheral surfaces of the dummy electrode layers are exposed from between the dielectric layers, and wherein the dummy electrode layer, which surrounds the perimeter of the whole of the inner electrode layers, is exposed from a side face of the capacitor.

12. The capacitor according to claim 10, wherein outer peripheral surfaces of the dummy electrode layers are exposed from between the dielectric layers.

13. The capacitor according to claim 10, wherein the inner electrode layers include first inner electrode layers and second inner electrode layers arranged alternately with the first inner electrode layers via the dielectric layer, and
  one of the dummy electrode layers is disposed so as to be set in substantially a same plane as that of either one of the first inner electrode layer and the second inner electrode layer.

14. The capacitor according to claim 10, further comprising: a via conductor penetrating at least one of the dielectric layers in a thicknesswise direction of the dielectric layer and electrically connected to at least one of the inner electrode layers.

15. A wiring board incorporating the capacitor according to claim 10.

* * * * *